United States Patent
Iwashita et al.

(10) Patent No.: US 7,598,017 B2
(45) Date of Patent: Oct. 6, 2009

(54) NEGATIVE RESIST COMPOSITION AND METHOD OF FORMING RESIST PATTERN

(75) Inventors: Jun Iwashita, Kawasaki (JP); Kazuhito Sasaki, Kawasaki (JP); Sho Abe, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/258,081

(22) Filed: Oct. 24, 2008

(65) Prior Publication Data

US 2009/0111054 A1 Apr. 30, 2009

(30) Foreign Application Priority Data

Oct. 30, 2007 (JP) ............................. 2007-282085

(51) Int. Cl.
*G03F 7/004* (2006.01)
*G03F 7/30* (2006.01)

(52) U.S. Cl. ............... 430/270.1; 430/325; 430/330; 430/905; 430/907; 430/910

(58) Field of Classification Search ............ 430/270.1, 430/325, 330, 905, 907, 910
See application file for complete search history.

(56) References Cited

U.S. PATENT DOCUMENTS

| 5,945,517 | A | 8/1999 | Nitta et al. |
| 6,153,733 | A | 11/2000 | Yukawa et al. |
| 6,420,503 | B1 | 7/2002 | Jayaraman et al. |
| 6,509,134 | B2 * | 1/2003 | Ito et al. ............... 430/270.1 |
| 2002/0146638 | A1 * | 10/2002 | Ito et al. ............... 430/270.1 |
| 2006/0008731 | A1 * | 1/2006 | Van Der Puy et al. .... 430/270.1 |
| 2006/0235174 | A1 | 10/2006 | Rhodes et al. |

FOREIGN PATENT DOCUMENTS

| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2006-291177 | 10/2006 |
| JP | 2006-321928 | 11/2006 |
| JP | 2007-086731 | 4/2007 |
| WO | WO 2004/074242 A2 | 9/2004 |
| WO | WO 2004/076495 A2 | 9/2004 |

OTHER PUBLICATIONS

D. Gil et al., "First Microprocessors with Immersion Lithograhy," Optical Microlithography XVIII, Proceedings of SPIE vol. 5754, pp. 119-128 (2005).
Shun-Ichi Kodama et al., "Synthesis of Novel Fluoropolymer for 157nm Photoresists by Cyclo-polymerization." Advances in Resist Technology and Processing XIX, Proceedings of SPIE vol. 4690 (2002).

* cited by examiner

*Primary Examiner*—John S Chu
(74) *Attorney, Agent, or Firm*—Knobbe, Martens, Olson & Bear, LLP

(57) ABSTRACT

A negative resist composition including:
  a fluorine-containing resin component (F) containing a structural unit (f1) represented by a general formula (f1-0) shown below, and a structural unit (f2) having an alkali-soluble group,
  an alkali-soluble resin component (A) excluding the fluorine-containing resin component (F),
  an acid generator component (B) that generates acid upon exposure, and
  a cross-linking component (C).

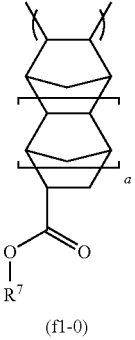

(f1-0)

[wherein, $R^7$ represents a fluorinated alkyl group, and a represents either 0 or 1.]

11 Claims, 1 Drawing Sheet

NEGATIVE RESIST COMPOSITION AND METHOD OF FORMING RESIST PATTERN

BACKGROUND OF THE INVENTION

1. Field of the Invention

The present invention relates to a negative resist composition and a method of forming a resist pattern, and relates particularly to a negative resist composition and method of forming a resist pattern that are ideal for liquid immersion lithography.

Priority is claimed on Japanese Patent Application No. 2007-282085, filed Oct. 30, 2007, the content of which is incorporated herein by reference.

2. Description of Related Art

In lithography techniques, for example, a resist film composed of a resist material is formed on a substrate, and the resist film is subjected to selective exposure of radial rays such as light or an electron beam through a mask having a predetermined pattern, followed by development, thereby forming a resist pattern having a predetermined shape on the resist film.

For miniaturization of semiconductor devices, shortening of the wavelength of the exposure light source, and increasing of the numerical aperture (NA) of the projector lens have progressed. Currently, exposure apparatuses in which an ArF excimer laser having a wavelength of 193 nm is used as an exposure light source and NA=0.84 have been developed. As shortening the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structural units derived from (meth)acrylate esters within the main chain (acrylic resins) are now typically used as base resins for resists that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (an immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as the phase shift method and modified illumination method. Currently, as the immersion exposure technique, techniques using an ArF excimer laser as an exposure source are being actively studied, and water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxymethyl group, tert-butyl group or tert-butoxycarbonyl group is introduced into a fluorine-containing polymeric compound, and the fluorine-containing polymeric compound is used as a base resin for a chemically amplified positive resist. However, when such a fluorine-containing polymeric compound is used as a base resin for a positive resist composition, disadvantages arise in that a large quantity of out-gas is generated following exposure, and the resistance to dry etching gases (namely, the etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

Further, fluorine-containing compounds are also being used in compositions for forming protective films for resists (see, for example, Patent Documents 1 and 2).

[Non-Patent Document 1]
Proceedings of SPIE (U.S.), vol. 5754, pp. 119-128 (2005)
[Non-Patent Document 2]
Proceedings of SPIE (U.S.), vol. 4690, pp. 76-83 (2002)
[Patent Document 1]
Japanese Unexamined Patent Application, First Publication No. 2006-321928
[Patent Document 2]
Japanese Unexamined Patent Application, First Publication No. 2007-086731

SUMMARY OF THE INVENTION

In immersion exposure, a resist material is required that exhibits not only general lithography properties (such as sensitivity, resolution and etching resistance), but also properties suited for immersion lithography. As a specific example, when the immersion medium is water, and immersion exposure is performed using a scanning-type immersion exposure apparatus such as that disclosed in Non-Patent Document 1, a "water tracking ability" wherein the immersion medium is capable of tracking the movement of the lens is required. When the water tracking ability is low, the exposure speed reduces, and as a result, there is a possibility that the productivity may be adversely affected. It is presumed that the water tracking ability can be improved by enhancing the hydrophobicity of the resist film (rendering the resist film hydrophobic), but in those cases where a negative resist composition is used in the immersion exposure, because the composition must be soluble in alkali developing solutions such as an aqueous solution of tetramethylammonium hydroxide (TMAH), a resin with a high level of hydrophilicity is typically used as the base resin for the negative resist composition. As a result, there are limitations on the use of the base resin to impart a degree of hydrophobicity that is suitable for immersion exposure. Further, if the resist film is simply rendered hydrophobic, then adverse effects are seen on the lithography properties, and for example, the resolution and sensitivity tend to deteriorate, and the quantity of scum generated tends to increase.

On the other hand, when a hydrophobic protective film is formed on top of a resist film, because the steps of forming the protective film and then removing the protective film must be added to the resist pattern formation process, the resist pattern formation process is less desirable than a process in which no protective film is formed from the perspective of throughput.

Thus, in immersion lithography, the development of materials having an appropriate level of hydrophobicity has become an important issue. However, currently, materials that combine favorable lithography properties with the properties required for immersion exposure and the like are almost unknown.

The present invention takes the above circumstances into consideration, with an object of providing a negative resist composition and a method of forming a resist pattern that are capable of forming a resist film having a high hydrophobicity at the film surface as well as favorable lithography properties.

In order to achieve the above object, the inventors of the present invention propose the aspects described below.

Namely, a first aspect of the present invention is a negative resist composition including:

a fluorine-containing resin component (F) containing a structural unit (f1) represented by general formula (f1-0) shown below, and a structural unit (f2) having an alkali-soluble group, an alkali-soluble resin component (A) excluding the fluorine-containing resin component (F), an acid generator component (B) that generates acid upon exposure, and a cross-linking component (C).

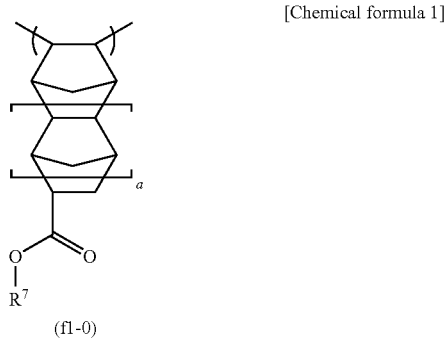

[Chemical formula 1]

(f1-0)

[wherein, $R^7$ represents a fluorinated alkyl group, and a represents either 0 or 1.]

A second aspect of the present invention is a method of forming a resist pattern, including: forming a resist film on a substrate using a negative resist composition according to the above first aspect, exposing the resist film, and subjecting the resist film to alkali developing to form a resist pattern.

In the present description and claims, a "structural unit" refers to a monomer unit that contributes to the formation of a resin component (namely, a polymer or copolymer).

An "alkyl group", unless otherwise specified, includes linear, branched and cyclic, monovalent saturated hydrocarbon groups.

A "lower alkyl group" is an alkyl group of 1 to 5 carbon atoms.

An "alkylene group", unless otherwise specified, includes linear, branched and cyclic, divalent saturated hydrocarbon groups.

A "fluorinated alkyl group" describes an alkyl group in which some or all of the alkyl group hydrogen atoms have been substituted with fluorine atoms.

A "perfluoroalkyl group" is an alkyl group in which all of the alkyl group hydrogen atoms have been substituted with fluorine atoms.

The term "aliphatic cyclic group" describes a monocyclic group or polycyclic group that has no aromaticity.

The term "exposure" is used as a general concept that includes irradiation with any form of radiation, including an ArF excimer laser, KrF excimer laser, $F_2$ excimer laser, as well as EUV (Extreme Ultra Violet), VUV (Vacuum Ultra Violet), EB (Electron Beam), X-ray and soft X-ray radiation.

The present invention is able to provide a negative resist composition and a method of forming a resist pattern that are capable of forming a resist film having a high hydrophobicity at the film surface as well as favorable lithography properties.

DETAILED DESCRIPTION OF THE INVENTION

<<Negative Resist Composition>>

Figure 1:
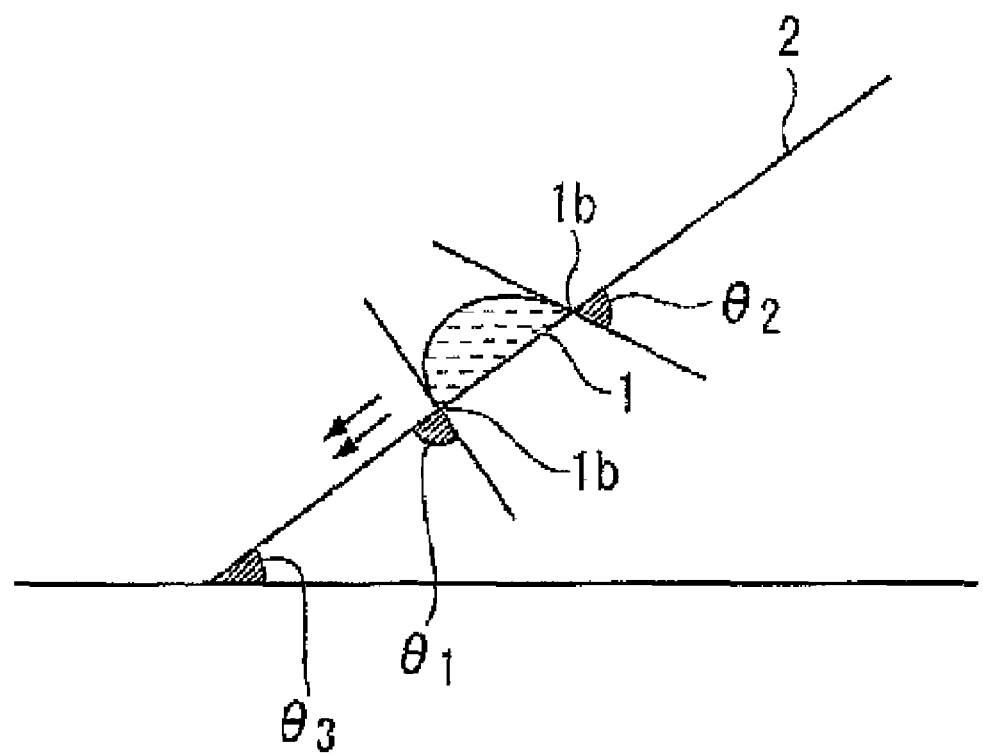
FIG. 1 is a diagram describing an advancing angle ($\theta_1$), a receding angle ($\theta_2$) and a sliding angle ($\theta_3$).

A negative resist composition of the present invention includes a fluorine-containing resin component (F) (hereafter, frequently referred to as "component (F)") containing a structural unit (f1) represented by general formula (f1-0) shown above and a structural unit (f2) having an alkali-soluble group, an alkali-soluble resin component (A) (hereafter, frequently referred to as "component (A)") excluding the fluorine-containing resin component (F), an acid generator component (B) (hereafter, frequently referred to as "component (B)") that generates acid upon exposure, and a cross-linking component (C) (hereafter, frequently referred to as "component (C)").

This negative resist composition is soluble within an alkali developing solution prior to exposure, but when acid is generated from the component (B) upon exposure, the action of the acid causes cross-linking between the component (A) and the component (C), making the composition insoluble in an alkali developing solution. Therefore, in the formation of a resist pattern, by conducting selective exposure of a resist film formed by applying the negative resist composition to a substrate, the exposed portions become insoluble in the alkali developing solution, whereas the unexposed portions remain alkali-soluble, meaning a negative resist pattern can be formed by alkali developing.

<Component (F)>

In the negative resist composition of the present invention, the component (F) is a fluorine-containing resist containing a structural unit (f1) represented by general formula (f1-0) shown above and a structural unit (f2) having an alkali-soluble group.

By including the component (F) with the components (A) to (C) described below, a resist film can be obtained that has high hydrophobicity at the film surface as well as favorable lithography properties.

Structural Unit (f1)

The component (F) contains a structural unit (f1) represented by general formula (f1-0) shown above. Including the structural unit (f1) further improves the hydrophobicity of the resist film surface.

In formula (f1-0), a is either 0 or 1, and if industrial availability is taken into consideration, is preferably 0.

In formula (f1-0), $R^7$ represents a fluorinated alkyl group, and is a linear, branched or cyclic alkyl group in which some or all of the hydrogen atoms have been substituted with fluorine atoms.

As the linear or branched alkyl group, alkyl groups of 1 to 10 carbon atoms are preferred, alkyl groups of 1 to 8 carbon atoms are more preferred, and alkyl groups of 1 to 5 carbon atoms are the most desirable. Examples of these alkyl groups include a methyl group, ethyl group, propyl group, isopropyl group, n-butyl group, isobutyl group, pentyl group, isopentyl group and neopentyl group, and a propyl group is particularly desirable.

As the cyclic alkyl group, groups of 4 to 12 carbon atoms are preferred, groups of 5 to 10 carbon atoms are more preferred, and groups of 6 to 10 carbon atoms are the most desirable.

Of the above groups, the fluorinated alkyl group represented by $R^7$ is preferably a linear or branched alkyl group in which one hydrogen atom has been substituted with a perfluoroalkyl group (namely, a group in which an alkylene group is bonded to a perfluoroalkyl group), is more preferably a $—(CH_2)_{n'}—CF_3$ or $—(CH_2)_{n'}—C_2F_5$ group [wherein, n'=1 to 3], and is most preferably a $—CH_2—CF_3$ or $—CH_2—C_2F_5$ group.

As the fluorinated alkyl group, groups in which the fluorination ratio (the ratio (%) of the number of fluorine atoms relative to the total number of hydrogen atoms and fluorine atoms within the fluorinated alkyl group) is from 30 to 90% are preferred, and groups with a fluorination ratio of 50 to 80% are even more desirable. Provided the fluorination ratio is no less than 30%, the composition provides a superior improvement in the hydrophobicity of the resist film surface. Further, provided the fluorination ratio is not more than 90%, the lithography properties can be improved.

The structural unit (f1) may include a substituent on the ring of the cyclic structure that constitutes a portion of the main chain. Examples of this substituent include a lower alkyl group of 1 to 5 carbon atoms, a fluorine atom or a fluorinated alkyl group. This fluorinated alkyl group is as defined above for $R^7$, and specific examples of the group include the same groups as those exemplified above for $R^7$.

As the structural unit (f1), one type may be used alone, or two or more types may be used in combination.

The proportion of the structural unit (f1) within the component (F), relative to the combined total of all the structural units that constitute the fluorine-containing resist component (F), is preferably within a range from 5 to 85 mol %, more preferably from 10 to 80 mol %, still more preferably from 20 to 75 mol %, still more preferably from 30 to 70 mol %, and most preferably from 50 to 70 mol %. Ensuring that the proportion is within this range is preferred in terms of suppressing the quantity of residues generated during alkali developing, and suppressing thickness loss during alkali developing.

Monomers that give rise to the structural unit (f1) can be synthesized by reacting a fluoroalkyl ester of (meth)acrylic acid with either cyclopentadiene or dicyclopentadiene using a conventional Diels-Alder reaction, as disclosed in Japanese Unexamined Patent Application, First Publication No. 2000-235263.

Structural Unit (f2)

In addition to the structural unit (f1) described above, the component (F) includes a structural unit (f2) having an alkali-soluble group.

By including the structural unit (f2), the solubility of the component (F) within alkali developing solutions is improved, and a variety of lithography properties such as the resolution and the resist pattern shape are also improved.

In the present description and claims, an "alkali-soluble group" refers to a group with a similar acid dissociation constant (pKa) to that of a phenolic hydroxyl group, and is typically a group that contains a group such as an alcoholic hydroxyl group or carboxyl group that imparts alkali solubility. In other words, an alkali-soluble group is a group with a small pKa value (and although there are no particular limitations on the value, ideal pKa values are within a range from 6 to 12).

Examples of the alkali-soluble group within the structural unit (f2) include groups with a similar pKa value to that of a phenolic hydroxyl group, such as groups that contain a group such as an alcoholic hydroxyl group or carboxyl group that imparts alkali solubility. Specific examples include an alcoholic hydroxyl group, the bonding position of which is not particularly limited, a hydroxyalkyl group in which the carbon atom at the α-position to the alcoholic hydroxyl group is substituted with an electron withdrawing group, and a carboxyl group.

In a hydroxyalkyl group in which the carbon atom at the α-position to the alcoholic hydroxyl group is substituted with an electron withdrawing group, examples of the electron withdrawing group include a halogen atom or a halogenated alkyl group or the like.

Examples of the halogen atom include a fluorine atom or chlorine atom or the like, although a fluorine atom is preferred.

Examples of the halogen within the halogenated alkyl group include the same halogen atoms as those described above. The alkyl group is preferably a lower alkyl group containing, for example, from 1 to 3 carbon atoms, and is preferably a methyl group or ethyl group, and most preferably a methyl group. Specific examples of the halogenated alkyl group include a trifluoromethyl group, difluoromethyl group, monofluoromethyl group and perfluoroethyl group, and of these, a trifluoromethyl group is particularly desirable.

The number of electron withdrawing groups may be either 1 or 2, but is preferably 2.

As the alkali-soluble group within the structural unit (f2), a fluorinated group also yields an improvement in the hydrophobicity, and is therefore preferred.

Specific examples of the alkali-soluble group include groups represented by general formula (f2-0-1) shown below, groups represented by general formula (f2-0-2) shown below, and groups represented by general formula (f2-0-3) shown below.

[Chemical formula 2]

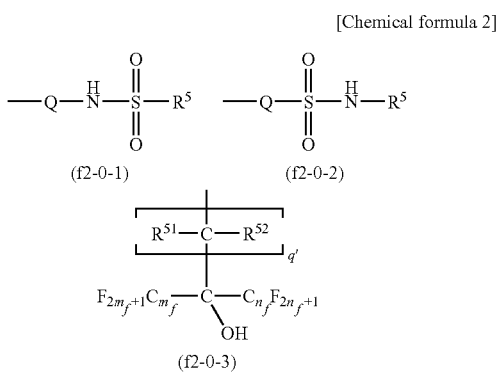

[In formula (f2-0-1), Q represents a divalent linking group or a single bond, and $R^5$ represents a fluorinated alkyl group; in formula (f2-0-2), Q and $R^5$ are as defined above; and in formula (f2-0-3), $R^{51}$ and $R^{52}$ each independently represents a hydrogen atom, a lower alkyl group of 1 to 5 carbon atoms, a fluorine atom or a fluorinated lower alkyl group, $m_f$ and $n_f$ each independently represents an integer of 0 to 5 (provided that $m_f+n_f\geq 1$), and q' represents an integer of 0 to 5.]

In formula (f2-0-1), Q represents either a divalent linking group or a single bond.

Examples of the divalent linking group include linear, branched or cyclic alkylene groups of 1 to 8 carbon atoms such as a methylene group, ethylene group, propylene group, isopropylene group, cyclopropylene group, n-butylene group, isobutylene group, pentene group, isopentene group, neopentene group, cyclopentylene group, cyclohexylene group, cycloheptylene group or cyclooctylene group. Further, the divalent linking group represented by Q may include a hetero atom, and additional examples include ether groups, ester groups, and groups in which at least one hydrogen atom and/or carbon atom within one of the above alkylene groups has been substituted with a hetero atom. Of these possibilities, in terms of ease of synthesis, a linear alkylene group is preferred, and a methylene group is particularly desirable.

$R^5$ represents a fluorinated alkyl group. The fluorinated alkyl group is a group in which some or all of the hydrogen atoms of a linear, branched or cyclic alkyl group have been substituted with fluorine atoms.

The linear or branched alkyl group typically contains from 1 to 10 carbon atoms, examples include the same groups as those exemplified above in relation to the linear or branched alkyl group represented by $R^7$ in general formula (f1-0), and a methyl group is particularly preferred.

The cyclic alkyl group typically contains from 4 to 12 carbon atoms, and examples include the same groups as those exemplified above in relation to the cyclic alkyl group represented by $R^7$ in general formula (f1-0).

The fluorination ratio within the fluorinated alkyl group is preferably from 10 to 100%, more preferably from 30 to 100%, still more preferably from 50 to 100%, and is most preferably 100%, meaning groups in which all the hydrogen atoms have been substituted with fluorine atoms are the most preferred. Provided the fluorination ratio is at least 10%, the composition provides a superior improvement in the hydrophobicity of the resist film surface.

Of the above possibilities, the fluorinated alkyl group of $R^5$ is preferably a linear or branched fluorinated alkyl group, is more preferably a fluorinated alkyl group of 1 to 5 carbon atoms, and is most preferably a perfluoroalkyl group in which all of the alkyl group hydrogen atoms have been substituted with fluorine atoms. Specific examples of such perfluoroalkyl groups include a trifluoromethyl group and a pentafluoroethyl group, and a trifluoromethyl group is the most desirable.

In formula (f2-0-2), Q and $R^5$ are as defined for Q and $R^5$ in formula (f2-0-1).

In formula (f2-0-3), $R^{51}$ and $R^{52}$ each independently represents a hydrogen atom, a lower alkyl group of 1 to 5 carbon atoms, a fluorine atom or a fluorinated lower alkyl group.

As the lower alkyl group of 1 to 5 carbon atoms for $R^{51}$ and $R^{52}$, a linear or branched lower alkyl group is preferred, specific examples include a methyl group, ethyl group, propyl group, isopropyl group, n-butyl group, isobutyl group, tert-butyl group, pentyl group, isopentyl group or neopentyl group, and a methyl group is particularly desirable.

Examples of the fluorinated lower alkyl group for $R^{51}$ and $R^{52}$ include groups in which at least one of the hydrogen atoms from an aforementioned lower alkyl group for $R^{51}$ and $R^{52}$ has been substituted with a fluorine atom. Of the various possibilities, $R^{51}$ and $R^{52}$ are preferably hydrogen atoms, and groups in which both $R^{51}$ and $R^{52}$ are hydrogen atoms are the most desirable.

$m_f$ and $n_f$ each independently represents an integer of 0 to 5 (provided that $m_f+n_f \geq 1$), and is preferably an integer of 1 to 3. In terms of achieving a superior effect for the present invention, $m_f$ and $n_f$ are most preferably both 1.

q' represents an integer of 0 to 5, is preferably an integer of 0 to 3, is more preferably either 0 or 1, and is most preferably 1.

Of the above, the alkali-soluble group in the structural unit (f2) is preferably at least one group selected from the group consisting of groups represented by general formula (f2-0-1), groups represented by general formula (f2-0-2), and groups represented by general formula (f2-0-3) and is most preferably at least one group selected from the group consisting of groups represented by general formula (f2-0-1) and groups represented by general formula (f2-0-3).

As the structural unit (f2), structural units having a cyclic structure in the main chain (hereafter frequently referred to as "cyclic main chain structural units") are particularly preferred, as such units yield resist films having high hydrophobicity at the film surface.

In the present description, a "cyclic main chain structural unit" describes a structural unit that constitutes the component (F), wherein the structural unit has a monocyclic or polycyclic ring structure, and at least one, and preferably two or more, of the carbon atoms within a ring of the cyclic structure constitute part of the main chain. Including a cyclic main chain structural unit also yields an improvement in the etching resistance. This improvement in etching resistance is thought to reflect the fact that introducing cyclic structures into the main chain increases the carbon density.

Examples of the cyclic main chain structural unit include structural units derived from polycycloolefins (polycyclic olefins), and dicarboxylic acid anhydride-containing structural units such as those exemplified below in relation to a structural unit (f3).

Of these, including a structural unit derived from a polycycloolefin in the main chain is preferred, as it results in particularly superior etching resistance when the composition is used to form a resist.

As the structural unit derived from a polycycloolefin, structural units having a basic structure represented by general formula (f2-0') shown below are preferred.

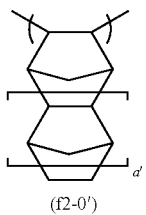

(f2-0')

[wherein, a' represents either 0 or 1.]

In formula (f2-0'), a' is either 0 or 1, and if industrial availability is taken into consideration, is preferably 0.

In the present description, a "structural unit having a basic structure represented by general formula (f2-0')" may be either a structural unit represented by general formula (f2-0') (namely, either a structural unit derived from bicyclo[2.2.1]-2-heptene (norbornene) or a structural unit derived from tetracyclo[4.4.0.1$^{2,5}$.1$^{7,10}$]-3-dodecene), or a structural unit that also includes a substituent on the cyclic structure. In other words, a "structural unit having a basic structure represented by general formula (f2-0')" includes structural units in which some or all of the hydrogen atoms bonded to the carbon atoms that constitute the cyclic structure (namely, bicyclo[2.2.1]-2-heptane or tetracyclo[4.4.0.1$^{2,5}$.1$^{7,10}$]-3-dodecane) are substituted with atoms or substituent groups other than hydrogen atoms.

The structural unit (f2) may also be a structural unit other than a cyclic main chain structural unit, such as a structural unit derived from acrylic acid. However, in terms of achieving a more favorable effect for the present invention, the proportion of cyclic main chain structural units within the component (F), relative to the combined total of all the structural units that constitute the component (F), is preferably within a range from 50 to 100 mol %, more preferably from 80 to 100 mol %, and most preferably 100 mol % for the combination of the structural unit (f1) and the structural unit (f2).

Specific examples of preferred units included within the structural unit (f2) include structural units (f2-0) represented by general formula (f2-0) shown below.

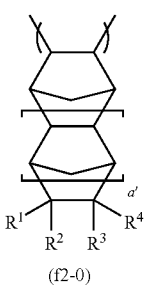

(f2-0)

[wherein, $R^1$ to $R^4$ each independently represents a hydrogen atom, a fluorine atom, a linear or branched alkyl group, a fluorinated alkyl group, a group represented by general formula (f2-0-1) shown above, a group represented by general formula (f2-0-2) shown above, or a group represented by general formula (f2-0-3) shown above, provided that at least one of $R^1$ to $R^4$ is a group represented by general formula (f2-0-1), a group represented by general formula (f2-0-2), or a group represented by general formula (f2-0-3), and a' represents either 0 or 1.]

The structural unit (f2-0) represented by general formula (f2-0) is a structural unit having a basic structure represented by general formula (f2-0') shown above, and also having at least one group represented by general formula (f2-0-1), one group represented by general formula (f2-0-2), or one group represented by general formula (f2-0-3) as a substituent at a specific position on the ring structure.

In the present invention, including a structural unit (f2-0) as the structural unit (f2) improves the hydrophobicity of the resist film surface. Further, the lithography properties are also improved.

In formula (f2-0), a' is as defined above for a' in formula (f2-0').

In formula (f2-0), $R^1$ to $R^4$ each independently represents a hydrogen atom, a fluorine atom, a linear or branched alkyl group, a fluorinated alkyl group, a group represented by general formula (f2-0-1), a group represented by general formula (f2-0-2), or a group represented by general formula (f2-0-3).

For $R^1$ to $R^4$, the linear or branched alkyl group is as defined above for $R^5$, and specific examples include the same groups as those exemplified above in the description of linear or branched alkyl groups for $R^5$.

The fluorinated alkyl group for $R^1$ to $R^4$ is as defined above for $R^5$, and specific examples include the same groups as those exemplified above in the description of fluorinated alkyl groups for $R^5$.

At least one of $R^1$ to $R^4$ must be a group represented by general formula (f2-0-1), a group represented by general formula (f2-0-2), or a group represented by general formula (f2-0-3), and a group represented by general formula (f2-0-1) or a group represented by general formula (f2-0-3) is preferred.

Of the various possibilities, structural units in which at least one of $R^1$ to $R^4$ is a group represented by general formula (f2-0-1) and the remaining 0 to 3 groups are one or more moieties selected from the group consisting of a hydrogen atom and linear or branched alkyl groups; and structural units in which at least one of $R^1$ to $R^4$ is a group represented by general formula (f2-0-3) and the remaining 0 to 3 groups are one or more moieties selected from the group consisting of a hydrogen atom and linear or branched alkyl groups are preferred.

Of these, structural units in which one of $R^1$ to $R^4$ is a group represented by general formula (f2-0-1) and the remaining three groups are hydrogen atoms; and structural units in which one of $R^1$ to $R^4$ is a group represented by general formula (f2-0-3) and the remaining three groups are hydrogen atoms are particularly desirable.

As the structural unit (f2), a structural unit represented by general formula (f2-1') shown below or a structural unit represented by general formula (f2-3') shown below is preferred.

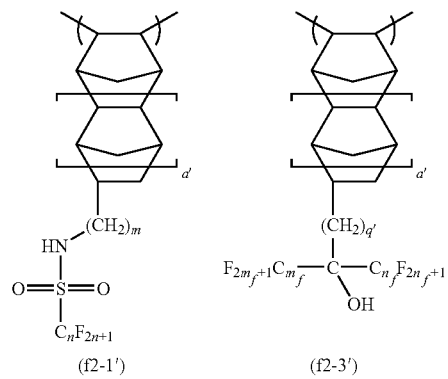

(f2-1')        (f2-3')

In formula (f2-1') and formula (f2-3'), a' is as defined above for a' in formula (f2-0').

In formula (f2-1'), m represents an integer of 1 to 5, preferably an integer of 1 to 3, and most preferably 1.

n is preferably an integer of 1 to 5, and is most preferably 1.

In formula (f2-3'), q' is as defined above for q' in formula (f2-0-3), and is most preferably 1.

$m_f$ and $n_f$ are as defined above for $m_f$ and $n_f$ in formula (f2-0-3), and are most preferably both 1.

As the structural unit (f2), one type may be used alone, or two or more types may be used in combination.

Of the various possibilities, the structural unit (f2) is preferably a structural unit represented by general formula (f2-1') shown above and/or a structural unit represented by general formula (f2-3') shown above.

The proportion of the structural unit (f2) within the component (F), relative to the combined total of all the structural units that constitute the fluorine-containing resist component (F), is preferably within a range from 15 to 95 mol %, more preferably from 20 to 90 mol %, still more preferably from 25 to 90 mol %, and most preferably from 30 to 90 mol %. By ensuring that the proportion is within this range, the lithography properties can be improved, and the generation of residues during alkali developing can be suppressed.

Monomers that give rise to the structural unit (f2) can be synthesized, for example, using the technique disclosed in U.S. Pat. No. 6,420,503.

Other Structural Unit (f3)

The component (F) may include another structural unit (hereafter referred to as a "structural unit (f3)") besides the structural unit (f1) and structural unit (f2) described above, provided the inclusion of this other structural unit does not impair the effects of the present invention.

There are no particular limitations on the structural unit (f3), provided it is not able to be classified as an aforementioned structural unit (f1) or (f2), and is derived from a monomer that is capable of copolymerization with the monomers that give rise to the structural units (f1) and (f2).

As the structural unit (f3), any structural unit derived from a conventional compound containing an ethylenic double bond can be used in accordance with the intended purpose.

As this structural unit (f3), more specific examples include a structural unit derived from an acrylate ester, a structural unit containing a dicarboxylic acid anhydride, a structural unit derived from a polycycloolefin having no substituents, and a structural unit derived from a polycycloolefin having a polycyclic alicyclic group as a substituent.

Examples of the structural unit derived from an acrylate ester include a structural unit derived from an acrylate ester that includes a lactone-containing cyclic group, a structural unit derived from an acrylate ester that includes a polar group-containing aliphatic hydrocarbon group, and a structural unit derived from an acrylate ester that includes a non-acid dissociable aliphatic polycyclic group.

The term "structural unit containing a dicarboxylic acid anhydride" describes a structural unit having a —C(O)—O—C(O)— structure. Examples of this acid anhydride-containing structural unit include structural units containing either a monocyclic or polycyclic cyclic acid anhydride. More specific examples include a structural unit derived from a monocyclic maleic anhydride shown below in formula (f31), a structural unit derived from a polycyclic maleic anhydride shown below in formula (f32), and a structural unit derived from itaconic anhydride shown below in formula (f33).

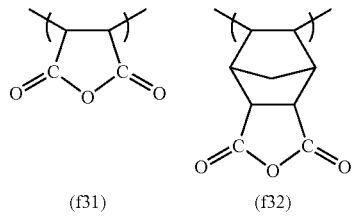

[Chemical formula 6]

(f31)        (f32)

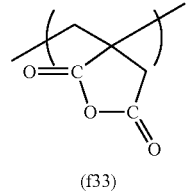

[Chemical formula 7]

(f33)

Examples of the structural unit derived from derived from a polycycloolefin having no substituents include units derived from bicyclo[2.2.1]-2-heptene (norbornene) and units derived from tetracyclo[4.4.0.1$^{2,5}$.1$^{7,10}$]-3-dodecene.

Furthermore, examples of the structural unit derived from a polycycloolefin having a polycyclic alicyclic group as a substituent include structural units having a polycyclic group such as a tricyclodecanyl group, adamantyl group or tetracyclododecanyl group bonded as a substituent to the ring of an aforementioned structural unit derived from a polycycloolefin having no substituents.

If the structural unit (f3) is included within the component (F), then the proportion of the structural unit (f3) relative to the combined total of all the structural units that constitute the component (F) is preferably within a range from 1 to 20 mol %, and more preferably from 3 to 10%.

In the present invention, the component (F) is a fluorine-containing resin including the structural unit (f1) and the structural unit (f2), and is preferably a fluorine-containing resin that includes the structural unit (f1) and the structural unit (f2) as the main components.

Here the term "main components" means that the combined quantity of the structural unit (f1) and the structural unit (f2), relative to the combined total of all the structural units that constitute the component (F), is preferably at least 70 mol %. This proportion is more preferably at least 80 mol %, still more preferably 90 mol % or higher, and is most preferably 100 mol %.

Examples of the component (F) include fluorine-containing resins formed solely from the structural unit (f1) and the structural unit (f2), and fluorine-containing resins formed from the structural unit (f1), the structural unit (f2) and the structural unit (f3).

Of these fluorine-containing resins, particularly preferred resins include:

fluorine-containing resins (F1-1) that include the structural unit (f1) and a structural unit (f2-1') represented by general formula (f2-0) in which at least one of $R^1$ to $R^4$ is an alkali-soluble group represented by general formula (f2-0-1);

fluorine-containing resins (F1-2) that include the structural unit (f1) and a structural unit (f2-3') represented by general formula (f2-0) in which at least one of $R^1$ to $R^4$ is an alkali-soluble group represented by general formula (f2-0-3); and fluorine-containing resins (F1-3) that include the structural unit (f1), the structural unit (f2-1') and the structural unit (f2-3').

In a fluorine-containing resin (F1-1), the quantity of the structural unit (f1), relative to the combined total of all the structural units that constitute the fluorine-containing resin (F1-1), is preferably from 25 to 75 mol %, more preferably from 30 to 70 mol %, and still more preferably from 35 to 65 mol %.

The quantity of the structural unit (f2-1'), relative to the combined total of all the structural units that constitute the fluorine-containing resin (F1-1), is preferably from 25 to 75 mol %, more preferably from 30 to 70 mol %, and still more preferably from 35 to 65 mol %.

In a fluorine-containing resin (F1-2), the quantity of the structural unit (f1), relative to the combined total of all the structural units that constitute the fluorine-containing resin (F1-2), is preferably from 25 to 75 mol %, more preferably from 30 to 70 mol %, and still more preferably from 35 to 65 mol %.

The quantity of the structural unit (f2-3'), relative to the combined total of all the structural units that constitute the fluorine-containing resin (F1-2), is preferably from 25 to 75 mol %, more preferably from 30 to 70 mol %, and still more preferably from 35 to 65 mol %.

In a fluorine-containing resin (F1-3), the quantity of the structural unit (f1), relative to the combined total of all the structural units that constitute the fluorine-containing resin (F1-3), is preferably from 10 to 70 mol %, more preferably from 15 to 65 mol %, and still more preferably from 20 to 60 mol %.

The quantity of the structural unit (f2-1'), relative to the combined total of all the structural units that constitute the fluorine-containing resin (F1-3), is preferably from 10 to 70 mol %, more preferably from 15 to 65 mol %, and still more preferably from 20 to 60 mol %.

The quantity of the structural unit (f2-3'), relative to the combined total of all the structural units that constitute the fluorine-containing resin (F1-3), is preferably from 10 to 80 mol %, more preferably from 15 to 75 mol %, and still more preferably from 20 to 70 mol %.

As the component (F), either one type of resin may be used alone, or two or more resins may be used in combination.

In the present invention, as the component (F), fluorine-containing resins (F1-1)' to (F1-3)' containing the types of structural units shown below are particularly preferred.

[Chemical formula 8]

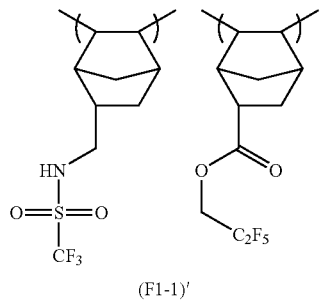

(F1-1)'

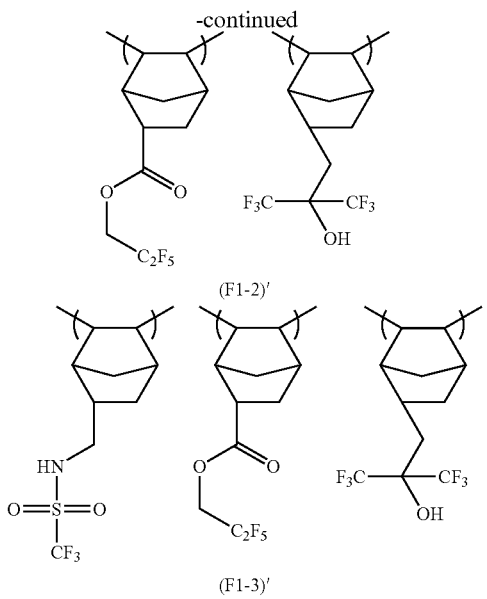

(F1-2)'

(F1-3)'

The component (F) can be synthesized, for example, using the method disclosed in Japanese Unexamined Patent Application, First Publication No. 2006-291177.

For the component (F), the dissolution rate within an alkali developing solution preferably has a lower limit of 3 nm/s, and is more preferably 5 nm/s or greater. The upper limit for this dissolution rate is preferably 900 nm/s, more preferably 800 nm/s, and still more preferably 750 nm/s. Provided the dissolution rate is not less than above lower limit and not more than the upper limit, a favorable balance can be achieved between the hydrophobicity improvement effect and the alkali developability.

The "dissolution rate within an alkali developing solution" refers to the dissolution rate (the speed of thickness loss: (thickness loss/immersion time; nm/s)) when a resin film is formed from the component (F), and the film is then immersed at 23° C. for a predetermined time period within an alkali developing solution having a predetermined concentration (a 2.38% by weight aqueous solution of tetramethylammonium hydroxide).

The dissolution rate can be controlled by varying factors such as the nature and respective proportions of the structural units that constitute the component (F), and the weight average molecular weight of the component (F).

The weight average molecular weight (Mw) (the polystyrene equivalent molecular weight measured by gel permeation chromatography (GPC)) of the component (F) is not particularly limited, but is preferably within a range from 1,000 to 10,000, and more preferably from 2,000 to 7,000.

Provided the Mw value is not more than 10,000, the effects of the present invention improve, and a particular improvement is seen in lithography properties such as the resolution. Furthermore, the component (F) exhibits superior solubility in an organic solvent (the component (S) described below), and the generation of foreign matter and developing defects can be suppressed. Here, "foreign matter" refers to solid matter such as microparticulate matter that is generated within the solution when the composition is converted to a solution form. Further, the term "developing defects" describes general abnormalities within a resist pattern that are detected when observed from directly above the alkali developed resist pattern using a surface defect detection apparatus (product name: "KLA") manufactured by KLA-TENCOR Corporation. Examples of these "abnormalities" include post-developing scum, foam, dust, bridges (structures that bridge different portions of the resist pattern), color irregularities, and foreign deposits.

Provided the Mw value is at least 1,000, the etching resistance improves, and other advantages are also realized, including suppression of swelling of the resist pattern during alkali developing, and suppression of pattern collapse.

The degree of dispersion (Mw/Mn (number average molecular weight)) is preferably from 1.0 to approximately 5.0, more preferably from 1.0 to 3.0, and is most preferably from 1.2 to 2.5.

As the component (F), one type of resin may be used alone, or two or more resins may be used in combination.

The quantity of the component (F) within the negative resist composition of the present invention is preferably within a range from 0.05 to 12 parts by weight, and more preferably from 0.1 to 10 parts by weight, relative to 100 parts by weight of the component (A). By ensuring that the quantity of the component (F) is within the above range, the hydrophobicity improvement effect is superior, and the lithography properties are improved further. Furthermore, if the quantity of the component (F) is within a range from 0.5 to 5 parts by weight, then the lithography properties can be improved even further.

<Component (A)>

In the negative resist composition of the present invention, the component (A) is preferably an alkali-soluble resin having a fluorinated hydroxyalkyl group such as that represented by general formula (a1-1-1) shown below.

Specific examples of preferred forms of the component (A) include components that include a resin (A1) containing a structural unit (a1) that contains, within the main chain, an aliphatic cyclic group having a fluorinated hydroxyalkyl group, and preferably also containing a structural unit (a2) having a hydroxyalkyl group.

Further, another preferred component (A) includes a resin (A2) containing a structural unit (a1') that contains an aliphatic cyclic group having a fluorinated hydroxyalkyl group, and preferably also containing a structural unit (a2') derived from an acrylate ester containing a hydroxyl group-containing aliphatic cyclic group, and/or a structural unit (a3') derived from an acrylic acid that has no cyclic structure and has an alcoholic hydroxyl group on a side chain.

The component (A) of the present invention excludes the component (F) described above.

(Resin (A1))

In the present invention, the resin (A1) includes a structural unit (a1) that contains, within the main chain, an aliphatic cyclic group having a fluorinated hydroxyalkyl group (hereafter, simply abbreviated as "structural unit (a1)").

Further, the resin (A1) preferably also includes, in addition to the structural unit (a1), a structural unit (a2) having a hydroxyalkyl group (hereafter, simply abbreviated as "structural unit (a2)").

Structural Unit (a1)

The resin (A1) includes a structural unit (a1) that contains, within the main chain, an aliphatic cyclic group having a fluorinated hydroxyalkyl group.

In the structural unit (a1), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the resin (A1).

In the present invention, by using a component (A) that includes a resin (A1) containing the structural unit (a1), the solubility of the resist film within an alkali developing solution is enhanced, and lithography properties such as the resolution, resist pattern shape, and line edge roughness (LER) are also improved. Further, because the resin (A1) includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may include substituent groups, and examples of these substituent groups include alkyl groups of 1 to 5 carbon atoms.

The expression "include substituent groups" means that some or all of the hydrogen atoms bonded to the carbon atoms that constitute the ring structure of the aliphatic cyclic group have been substituted with substituent groups (atoms or groups other than a hydrogen atom). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic groups include groups in which two or more hydrogen atoms have been removed from a cycloalkane. Specific examples include groups in which two or two hydrogen atoms have been removed from cyclopentane or cyclohexane.

Examples of the polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions used in ArF excimer laser processes.

Of the various possibilities, groups in which two or more hydrogen atoms have been removed from cyclopentane, cyclohexane, adamantane, norbornane or tetracyclododecane are readily available industrially, and are consequently preferred.

Of the alicyclic groups exemplified above, groups such as those shown in a structural unit (a1-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1), structural units (a1-1) represented by general formula (a1-1) shown below are preferred. By including the structural unit (a1-1), the solubility of the resin in an alkali developing solution improves significantly. Furthermore, the lithography properties such as the resolution are also improved.

[Chemical formula 9]

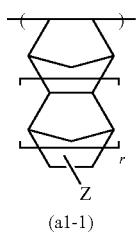

(a1-1)

[wherein, Z represents a fluorinated hydroxyalkyl group, and r is either 0 or 1.]

In formula (a1-1), r is either 0 or 1, and in terms of industrial availability, is preferably 0.

Further, in formula (a1-1), examples of the "fluorinated hydroxyalkyl group" represented by Z include the same groups as those exemplified above. Of these, Z is preferably a group represented by general formula (a1-1-1) shown below, as such groups yield a particularly superior resist pattern shape as well as reduced levels of line edge roughness (LER).

"Line edge roughness (LER)" refers to non-uniform unevenness in the side walls of pattern lines.

[Chemical formula 10]

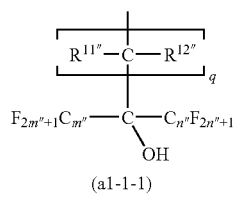

(a1-1-1)

[wherein, $R^{11''}$ and $R^{12''}$ each independently represents a hydrogen atom or a lower alkyl group, m'' and n'' each independently represents an integer of 1 to 5, and q also represents an integer of 1 to 5.]

In formula (a1-1-1), $R^{11''}$ and $R^{12''}$ each independently represents a hydrogen atom or a lower alkyl group.

As the lower alkyl group, a linear or branched lower alkyl group of 1 to 5 carbon atoms is preferred, and specific examples include a methyl group, ethyl group, propyl group, isopropyl group, n-butyl group, isobutyl group, tert-butyl group, pentyl group, isopentyl group or neopentyl group, and a methyl group is particularly desirable.

Of the various possibilities, groups in which both $R^{11''}$ and $R^{12''}$ are hydrogen atoms are particularly desirable.

q represents an integer of 1 to 5, and preferably an integer of 1 to 3, and is most preferably 1.

m'' and n'' each independently represents an integer of 1 to 5, and preferably an integer of 1 to 3. Groups in which both m'' and n'' are 1 are preferred in terms of ease of synthesis.

The structural unit (a1) may use either one type of structural unit, or a mixture of two or more types.

The proportion of the structural unit (a1) within the resin (A1), relative to the combined total of all the structural units that constitute the resin (A1), is preferably within a range from 50 to 90 mol %, more preferably from 55 to 90 mol %, and still more preferably from 60 to 80 mol %. Making this proportion at least as large as the lower limit of the above-mentioned range yields an improvement in the effects achieved by including the structural unit (a1), whereas by making the proportion no more than the upper limit of the above-mentioned range, a good balance can be achieved with the other structural units.

Structural Unit (a2)

In addition to the structural unit (a1), the resin (A1) preferably also includes a structural unit (a2) having a hydroxyalkyl group.

In the present invention, including a resin (A1) containing the structural unit (a2) within the component (A) improves the solubility of the component (A) within an alkali developing solution. Further, the cross-linking of the component (A) with the component (C) is enhanced, meaning the difference in the solubility within the alkali developing solution (the contrast) between the exposed portions and the unexposed portions can be increased, enabling the composition to function more effectively as a negative resist.

As the structural unit (a2), units such as a structural unit (a210) that contains, within the main chain, an aliphatic cyclic group having a hydroxyalkyl group (hereafter abbreviated as "structural unit (a210)"), and a structural unit (a220) derived from an acrylate ester having a hydroxyl group-containing alkyl group (hereafter abbreviated as "structural unit (a220)") are preferred.

Structural Unit (a210)

In the present invention, the structural unit (a210) is a structural unit that contains, within the main chain, an aliphatic cyclic group having a hydroxyalkyl group.

Examples of the structural unit (a210) include the same units as those exemplified above for the structural unit (a1), with the exception that the "fluorinated hydroxyalkyl group" within the structural unit (a1) is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within the definition of the structural unit (a210), structural units (a2-1) represented by general formula (a2-1) shown below are preferred. By including the structural unit (a2-1), lithography properties such as the resolution, resist pattern shape and line width roughness (LWR) are improved. Further, a favorable contrast is more readily obtained, and the etching resistance also improves.

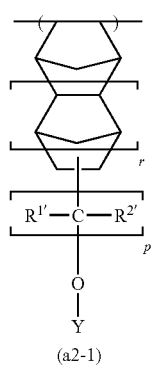

[Chemical formula 11]

(a2-1)

[wherein, $R^{1\prime}$ and $R^{2\prime}$ each independently represents a hydrogen atom or a lower alkyl group, Y represents a hydrogen atom or a hydroxyalkyl group, r represents either 0 or 1, and p represents an integer of 1 to 3.]

The structural unit (a2-1) represented by general formula (a2-1) is a structural unit containing, within the main chain, a norbornane or tetracyclododecane structure having a hydroxyalkyl group.

In formula (a2-1), $R^{1\prime}$ and $R^{2\prime}$ each independently represents a hydrogen atom or a lower alkyl group. Examples of the lower alkyl group include the same groups as those exemplified above in relation to the lower alkyl groups represented by $R^{11\prime\prime}$ and $R^{12\prime\prime}$ in formula (a1-1-1). Of the various possibilities, groups in which both $R^{1\prime}$ and $R^{2\prime}$ are hydrogen atoms are particularly desirable.

Y represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y is most preferably a hydrogen atom.

r is either 0 or 1, and is preferably 0.

p represents an integer of 1 to 3, is preferably 1 or 2, and is most preferably 1.

Specific examples of the structural unit (a2-1) include units represented by chemical formulas (a2-1-1) to (a2-1-7) shown below.

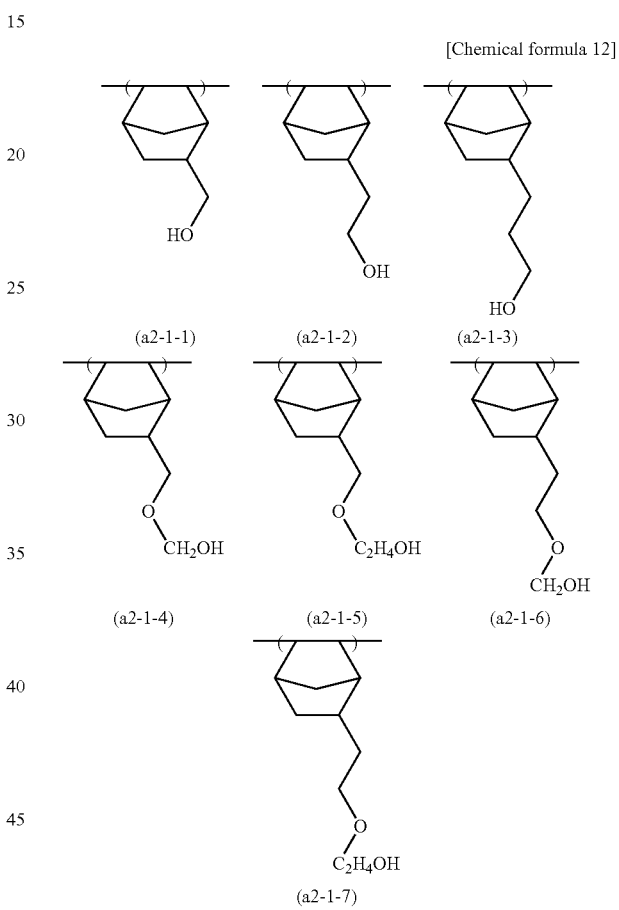

[Chemical formula 12]

Of these structural units, those represented by the above-mentioned chemical formulas (a2-1-1), (a2-1-2) and (a2-1-3) are preferred.

The structural unit (a210) may use either one type of structural unit, or a mixture of two or more types.

The proportion of the structural unit (a210) within the resin (A1), relative to the combined total of all the structural units that constitute the resin (A1), is preferably within a range from 10 to 50 mol %, more preferably from 15 to 50 mol %, and still more preferably from 20 to 45 mol %. Making this proportion at least as large as the lower limit of the above-mentioned range improves the effects achieved by including the structural unit (a210) such as improving the alkali solubility and making a favorable contrast more readily obtainable. In contrast, by making the proportion no more than the upper limit of the above-mentioned range, a good balance can be achieved with the other structural units.

Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter abbreviated as "structural unit (a221)"), then the resist pattern swelling suppression effect is further enhanced. Further, the resolution is also improved. Furthermore, favorable levels of contrast and etching resistance are also more readily obtained.

Examples of the structural unit (a221) include those units, amongst the structural units exemplified below in the description of a "structural unit (a2')" derived from an acrylate ester containing a hydroxyl group-containing aliphatic cyclic group" that constitutes a resin (A2) described below, in which the aliphatic cyclic group is a saturated hydrocarbon group. Of these structural units, units in which the substituent bonded to the α-position of the acrylate ester is a fluorinated lower alkyl group are particularly preferred, and this substituent is most preferably a trifluoromethyl group (—CF$_3$).

Furthermore, if the structural unit (a220) is a structural unit that includes a hydroxyl group-containing chain-like alkyl group (hereafter abbreviated as "structural unit (a222)"), then the hydrophilicity of the entire component (A) is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units exemplified below in the description of a "structural unit (a3') derived from an acrylic acid that has no cyclic structure and has an alcoholic hydroxyl group on a side chain" that constitutes the resin (A2) described below, that include a hydroxyalkyl group. Of these structural units, units having a hydroxyalkyl group at the acrylate ester portion are preferred, structural units in which the substituent bonded to the α-position of the acrylate ester is a fluorinated lower alkyl group are particularly preferred, and this substituent is most preferably a trifluoromethyl group (—CF$_3$).

The structural unit (a220) may use either one type of structural unit, or a mixture of two or more types.

The proportion of the structural unit (a220) within the resin (A1), relative to the combined total of all the structural units that constitute the resin (A1), is preferably within a range from 10 to 80 mol %, more preferably from 15 to 60 mol %, and still more preferably from 20 to 55 mol %. Making this proportion at least as large as the lower limit of the abovementioned range ensures that the effects obtained by including the structural unit (a220) are achieved, whereas by making the proportion no more than the upper limit of the abovementioned range, a good balance can be achieved with the other structural units.

In those cases where the structural unit (a220) includes both the structural unit (a221) and the structural unit (a222), the mixing ratio between the two structural units, reported as a molar ratio, is preferably such that structural unit (a221): structural unit (a222) is from 9:1 to 1:9, more preferably from 8:2 to 2:8, and most preferably from 6:4 to 7:3.

By including the structural unit (a221) and the structural unit (a222) in a favorable balance that satisfies the abovementioned mixing ratio, a favorable exposure margin can be obtained. Further, a suitable level of contrast is obtained, and the resolution is improved. Moreover, the etching resistance also improves.

Other Structural Units

In the negative resist composition of the present invention, besides the structural units (a1) and (a2) described above, the component (A) may also include other structural units typically used in the component (A) of conventional chemically amplified resist compositions.

However, in the present invention, the resin (A1) is preferably a resin in which the structural units (a1) and (a2) represent the main components.

Here the term "main components" means that the combined quantity of the structural unit (a1) and the structural unit (a2), relative to the combined total of all the structural units that constitute the component (A), is preferably at least 70 mol %. This proportion is more preferably 80 mol % or higher, and may be 100 mol %. Of the various possibilities, resins formed solely from the structural units (a1) and (a2) are the most desirable.

In the present invention, the combination of the structural unit (a1) and the structural unit (a2) within the resin (A1) is preferably a combination of the structural unit (a1) and the structural unit (a210). Of the various possibilities, the resin (A1) is preferably a resin containing the structural unit (a1-1) represented by the above-mentioned general formula (a1-1) and the structural unit (a2-1) represented by the above-mentioned general formula (a2-1).

Preferred examples of the resin (A1) include resins containing the combinations of structural units represented by chemical formulas (A1-1) to (A1-4) shown below.

[Chemical formula 13]

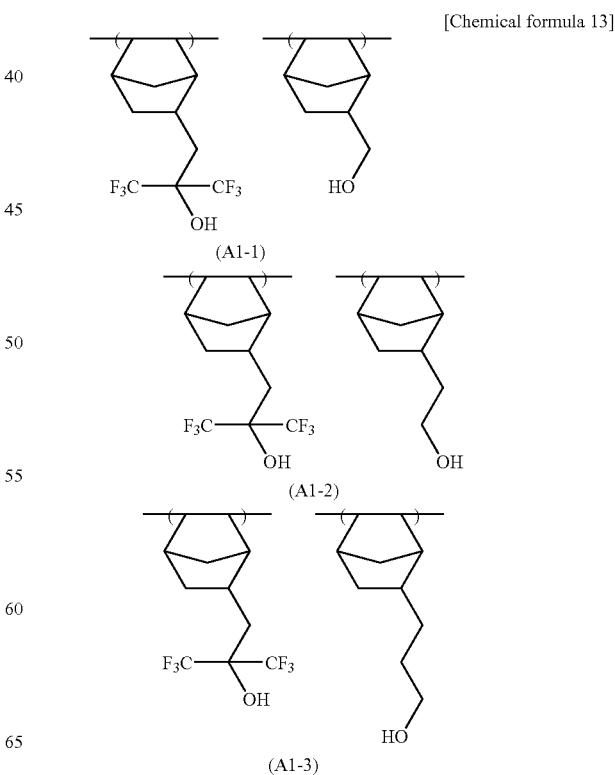

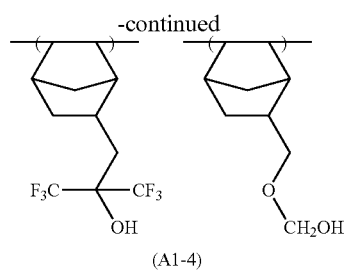

(A1-4)

Of the above resins, the resin (A1) is preferably a resin that includes at least one combination of structural units selected from the combinations represented by chemical formulas (A1-1) to (A1-4), and is most preferably a resin including the combination of structural units represented by chemical formula (A1-1).

In the present invention, the weight average molecular weight (Mw, the polystyrene equivalent molecular weight measured by gel permeation chromatography) of the resin (A1) is preferably within a range from 2,000 to 10,000, more preferably from 3,000 to 6,000, and most preferably from 3,000 to 5,000. Ensuring that this molecular weight is at least as large as the lower limit of the above-mentioned range enables good contrast to be obtained, whereas ensuring the molecular weight is no more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the degree of dispersion (Mw/Mn) is preferably from 1.0 to 5.0, and more preferably from 1.0 to 2.5. Mn represents the number average molecular weight.

When the resin (A1) is used in the component (A), one type of the resin (A1) may be used alone, or a mixture of two or more types may be used.

In those cases where the resin (A1) is used, the proportion of the resin (A1) within the component (A) is preferably at least 70 mol %, more preferably 80 mol % or greater, and is most preferably 100 mol %.

(Resin (A2))

In the present invention, the resin (A2) includes a structural unit (a1') that contains an aliphatic cyclic group having a fluorinated hydroxyalkyl group.

Further, in addition to the structural unit (a1'), the resin (A2) preferably also includes a structural unit (a2') derived from an acrylate ester containing a hydroxyl group-containing aliphatic cyclic group.

Furthermore, in addition to the structural unit (a1'), or in addition to a combination of the structural unit (a1') and the structural unit (a2'), the resin (A2) preferably also includes a structural unit (a3') derived from an acrylic acid that has no cyclic structure and has an alcoholic hydroxyl group on a side chain.

In the present descriptions and the claims, the expression "structural unit derived from an acrylate ester" refers to a structural unit that is formed by the cleavage of the ethylenic double bond of an acrylate ester.

The term "acrylate ester" is a generic term that includes the acrylate ester having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

In the acrylate ester, specific examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group, and neopentyl group.

In the halogenated lower alkyl group, the hydrogen atoms substituted with halogen atoms may represent either some, or all, of the hydrogen atoms that constitute the alkyl group.

Examples of the halogen atom include a fluorine atom, chlorine atom, bromine atom or iodine atom, and a fluorine atom is particularly preferred.

In the present invention, it is preferable that a hydrogen atom, a lower alkyl group or a halogenated lower alkyl group is bonded to the α-position of the acrylate ester, a hydrogen atom, a lower alkyl group or a fluorinated lower alkyl group is more preferred, and in terms of industrial availability, a hydrogen atom or a methyl group is the most desirable.

Structural Unit (a1')

The structural unit (a1') is a structural unit that includes an aliphatic cyclic group having a fluorinated hydroxyalkyl group. Including the structural unit (a1') improves the solubility in an alkali developing solution. Further, swelling of the resist pattern is suppressed, and lithography properties such as the resolution, pattern shape and LWR are improved.

The aliphatic cyclic group having a fluorinated hydroxyalkyl group is the same as that described above for the structural unit (a1), and examples of the group include the same groups as those exemplified above in relation to the structural unit (a1). However, the structural unit (a1') is preferably not part of the main chain of the resin (A2). As the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a1') is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a1'), structural units (a1'-1) represented by general formula (1) shown below are preferred.

[Chemical formula 14]

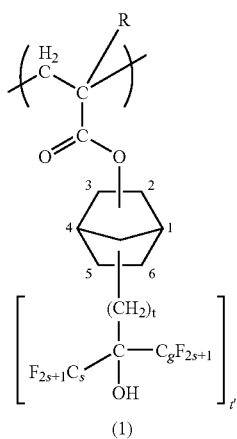

(1)

[wherein, R represents a hydrogen atom, a lower alkyl group or a halogenated lower alkyl group, and s, t and t: each independently represents an integer of 1 to 5.]

In formula (1), R represents a hydrogen atom, a lower alkyl group or a halogenated lower alkyl group.

Examples of the lower alkyl group or halogenated lower alkyl group for R include the same groups as those exemplified above for the lower alkyl group or halogenated lower alkyl group that may be bonded to the α-position of the above-mentioned acrylate ester.

In the present invention, R is preferably a hydrogen atom or a lower alkyl group, and in terms of industrial availability, is most preferably a hydrogen atom or a methyl group.

Each s independently represents an integer of 1 to 5, and is preferably an integer of 1 to 3, and most preferably 1.

t represents an integer of 1 to 5, preferably an integer of 1 to 3, and most preferably 1.

t' represents an integer of 1 to 3, preferably an integer of 1 to 2, and most preferably 1.

The structural unit (a1'-1) represented by general formula (1) preferably has a 2-norbornyl group or 3-norbornyl group bonded to the terminal of the carboxyl group of the (α-lower alkyl)acrylic acid. The fluorinated alkyl alcohol is preferably bonded to the 5th or 6th position of the norbornyl group.

The structural unit (a1') may use either one type of structural unit, or a mixture of two or more types.

The proportion of the structural unit (a1') within the resin (A2), relative to the combined total of all the structural units that constitute the resin (A2), is preferably within a range from 10 to 90 mol %, more preferably from 20 to 90 mol %, still more preferably from 40 to 90 mol %, and most preferably from 45 to 85 mol %. Making this proportion at least as large as the lower limit of the above-mentioned range ensures that the effects obtained by including the structural unit (a1') are achieved, whereas by making the proportion no more than the upper limit of the above-mentioned range, a good balance can be achieved with the other structural units.

Structural Unit (a2')

In addition to the structural unit (a1'), the resin (A2) preferably also includes a structural unit (a2') derived from an acrylate ester containing a hydroxyl group-containing aliphatic cyclic group.

When a resin (A2) that includes the structural unit (a2') is blended into the negative resist composition, the hydroxyl group (the alcoholic hydroxyl group) of this structural unit (a2') reacts with the component (C) under the action of the acid generated from the component (B), and this reaction causes the resin (A2) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those exemplified above in relation to the structural unit (a1).

As the aliphatic cyclic group of the structural unit (a2'), of the groups described above, a cyclohexyl group, adamantyl group, norbornyl group or tetracyclododecanyl group are readily available commercially, and are consequently preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a2'), the hydroxyl group-containing aliphatic cyclic group is preferably bonded to the oxygen atom at the terminal of the ester group (—C(O)—O—) of the acrylate ester.

In such cases, in the structural unit (a2'), another substituent may be bonded to the α-position (the α-position carbon atom) of the acrylate ester instead of a hydrogen atom. Examples of preferred substituents include a lower alkyl group or a halogenated lower alkyl group.

Examples of the lower alkyl group or halogenated lower alkyl group include the same groups as those exemplified for R within general formula (1) representing the above-mentioned structural unit (a1'). Of the various moieties that can be bonded to the α-position, a hydrogen atom or a lower alkyl group is preferred, and a hydrogen atom or methyl group is particularly desirable.

As the structural unit (a2'), structural units (a2'-1) represented by general formula (2) shown below are preferred.

[Chemical formula 15]

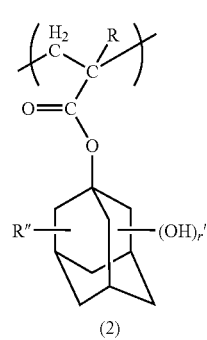

(2)

[wherein, R is as defined for R in general formula (1), R" represents a hydrogen atom, a lower alkyl group, or an alkoxy group of 1 to 5 carbon atoms, and r' represents an integer of 1 to 3.]

R is as defined above for R in general formula (1).

The lower alkyl group for R" is as defined above for the lower alkyl group for R in general formula (1).

In general formula (2), R and R" are both preferably hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a2') may use either one type of structural unit, or a mixture of two or more types.

The proportion of the structural unit (a2') within the resin (A2), relative to the combined total of all the structural units that constitute the resin (A2), is preferably within a range from 10 to 70 mol %, more preferably from 10 to 50 mol %, and most preferably from 20 to 40 mol %. Making this proportion at least as large as the lower limit of the abovementioned range ensures that the effects obtained by including the structural unit (a2') are achieved, whereas by making the proportion no more than the upper limit of the abovementioned range, a good balance can be achieved with the other structural units.

Structural Unit (a3')

In addition to the structural unit (a1'), or in addition to both the structural unit (a1') and the structural unit (a2'), the resin (A2) preferably also includes a structural unit (a3') derived from an acrylic acid that has no cyclic structure and has an alcoholic hydroxyl group on a side chain.

When a resin (A2) that includes the structural unit (a3') is blended into the negative resist composition, the alcoholic hydroxyl group of this structural unit (a3') reacts with the component (C), together with the hydroxyl group of the structural unit (a2'), under the action of the acid generated from the component (B).

Accordingly, the resin (A2) changes more readily from a state that is soluble in the alkali developing solution to a state that is insoluble, which has the effect of improving the lithography properties such as the resolution. Further, thickness loss can also be suppressed. Furthermore, the controllability of the cross-linking reaction that occurs during pattern formation improves. Moreover, the film density also tends to increase. As a result, the heat resistance tends to improve. Moreover, the etching resistance also improves.

In the structural unit (a3'), the expression "has no cyclic structure" means that the structural unit includes no aliphatic cyclic groups or aromatic groups.

The structural unit (a3') is readily distinguishable from the structural unit (a2') as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a1):

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a3'), the hydroxyalkyl group preferably exists at either one, or both of these locations.

In those cases where the hydroxyalkyl group is not bonded to the α-position, the hydrogen atom at the α-position carbon atom may be replaced with a lower alkyl group or a halogenated lower alkyl group. Examples of this lower alkyl group or halogenated lower alkyl group include the same groups as those exemplified above for R within general formula (1).

As the structural unit (a3'), structural units (a3'-1) represented by general formula (3) shown below are preferred.

[Chemical formula 16]

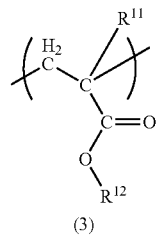

(3)

[wherein, $R^{11}$ represents a hydrogen atom, a lower alkyl group, a halogenated lower alkyl group or a hydroxyalkyl group, and $R^{12}$ represents a hydrogen atom, an alkyl group or a hydroxyalkyl group, provided that at least one of $R^{11}$ and $R^{12}$ represents a hydroxyalkyl group.]

The hydroxyalkyl group for $R^{11}$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The lower alkyl group for $R^{11}$ is preferably an alkyl group of not more than 10 carbon atoms, even more preferably an alkyl group of 1 to 8 carbon atoms, and is most preferably an ethyl group or methyl group.

The halogenated lower alkyl group for $R^{11}$ is preferably a lower alkyl group of not more than 5 carbon atoms (most preferably an ethyl group or methyl group) in which some or all of the hydrogen atoms have been substituted with halogen atoms (and preferably fluorine atoms).

As the alkyl group and hydroxyalkyl group for $R^{12}$, the same groups as the lower alkyl group and hydroxyalkyl group of $R^{11}$ can be exemplified.

Specific examples of the structural unit (a3'-1) represented by general formula (3) include structural units derived from α-(hydroxyalkyl)acrylic acids (not including structural units derived from acrylate esters), structural units derived from alkyl α-(hydroxyalkyl)acrylate esters, and structural units derived from hydroxyalkyl (α-alkyl) acrylate esters.

Of these, including a structural unit derived from an alkyl α-(hydroxyalkyl)acrylate ester as the structural unit (a3') is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a3') is preferred in terms of improving the cross-linking efficiency. Of such units, structural units derived from hydroxyethyl α-methyl-acrylate or hydroxymethyl α-methyl-acrylate are particularly desirable.

The structural unit (a3') may use either one type of structural unit, or a mixture of two or more types.

The proportion of the structural unit (a3') within the resin (A2), relative to the combined total of all the structural units that constitute the resin (A2), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a3') are achieved. By making the proportion no more than the upper limit of the above-mentioned range, a good balance can be achieved with the other structural units.

Other Structural Units

Besides each of the structural units (a1') to (a3') described above, the resin (A2) may also include other copolymerizable structural units.

As such structural units, any of the structural units used in known resin components of conventional chemically amplified resist compositions can be used. An example is a structural unit (a4') derived from an acrylate ester that includes a lactone-containing monocyclic or polycyclic group.

As the structural unit (a4'), any unit can be used without any particular limitations. Specifically, examples of lactone-containing monocyclic groups include groups in which one hydrogen atom has been removed from γ-butyrolactone. Further, examples of lactone-containing polycyclic groups include groups in which one hydrogen atom has been removed from a lactone ring-containing bicycloalkane, tricycloalkane, or tetracycloalkane.

The structural unit (a4') may use either one type of structural unit or a mixture of two or more types.

If the structural unit (a4') is included in the resin (A2), then the proportion of the structural unit (a4') within the resin (A2), relative to the combined total of all the structural units that constitute the resin (A2), is preferably within a range from 10 to 70 mol %, more preferably from 10 to 40 mol %, and most preferably from 10 to 25 mol %. Making this proportion at least as large as the lower limit of the above-mentioned range ensures that the effects obtained by including the structural unit (a4') are achieved, whereas by making the proportion no more than the upper limit of the above-mentioned range, a good balance can be achieved with the other structural units.

However, in the present invention, the resin (A2) is preferably a resin in which the structural units (a1') to (a3') represent the main components.

Here, the term "main components" means that the combined quantity of the structural units (a1') to (a3') represents at least 50 mol %, preferably at least 70 mol %, and more preferably 80 mol % or greater, of all the structural units. Resins (A2) in which this proportion is 100 mol %, namely resins (A2) composed solely of the structural unit (a1'), the structural unit (a2') and the structural unit (a3'), are the most desirable.

As the resin (A2), resins that include a combination of structural units such as that represented by formula (A2-1) shown below are particularly desirable.

[Chemical formula 17]

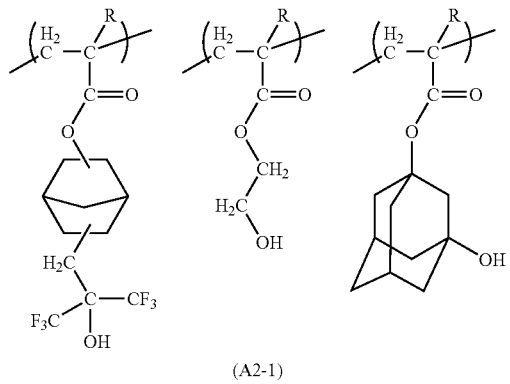

(A2-1)

[wherein, R is as defined above for R in general formula (1).]

In the present invention, the weight average molecular weight (Mw) of the resin (A2) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the degree of dispersion (Mw/Mn) is preferably from 1.0 to 5.0, and more preferably from 1.0 to 2.5.

When the resin (A2) is used in the component (A), one type of the resin (A2) may be used alone, or a mixture of two or more types may be used.

In those cases where the resin (A2) is used, the proportion of the resin (A2) within the component (A) is preferably at least 50 mol %, more preferably at least 70 mol %, still more preferably 80 mol % or greater, and is most preferably 100 mol %.

The component (A) used in the present invention can be synthesized, for example, by the method disclosed in International Patent Publication 2004/076495 pamphlet, or a method in which the monomers that give rise to each of the structural units are subjected to a radical polymerization using normal methods.

Besides the resin (A1) and the resin (A2), the component (A) may also use other polymeric compounds used within conventional negative resist compositions (such as hydroxystyrene resins, novolak resins or acrylic resins).

In the present invention, the quantity of the component (A) within the negative resist composition may be adjusted in accordance with the resist film thickness that is to be formed.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt-based acid generator, a compound represented by general formula (b-1) or (b-2) shown below can be preferably used.

[Chemical formula 18]

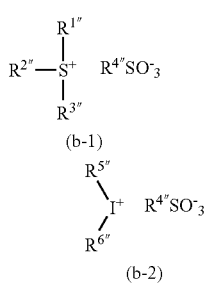

[wherein R¹″ to R³″, R⁵″ and R⁶″ each independently represents an aryl group or alkyl group, wherein two of R¹″ to R³″ in formula (b-1) may be bonded to each other to form a ring with the sulfur atom; and R⁴″ represents a linear, branched or cyclic alkyl group or fluorinated alkyl group, with the proviso that at least one of R¹″ to R³″ represents an aryl group, and at least one of R⁵″ and R⁶″ represents an aryl group.

In formula (b-1), R¹″ to R³″ each independently represents an aryl group or an alkyl group. Two of R¹″ to R³″ in formula (b-1) may be bonded to each other to form a ring with the sulfur atom.

Further, among R¹″ to R³″, at least one group represents an aryl group. Among R¹″ to R³″, two or more groups are preferably aryl groups, and it is particularly desirable that all of R¹″ to R³″ are aryl groups.

The aryl group for R¹″ to R³″ is not particularly limited. For example, an aryl group having 6 to 20 carbon atoms may be used, in which some or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, ethyl group, propyl group, n-butyl group, or tert-butyl group.

The alkoxy group, with which hydrogen atoms of the aryl group may be substituted, is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom, with which hydrogen atoms of the aryl group may be substituted, is preferably a fluorine atom.

The alkyl group for R¹″ to R³″ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group or decanyl group, and a methyl group is most preferable because it is excellent in resolution and can be synthesized at a low cost.

It is particularly desirable that each of R¹″ to R³″ is a phenyl group or a naphthyl group.

When two of R¹″ to R³″ in formula (b-1) are bonded to each other to form a ring with the sulfur atom, it is preferable that the two of R¹″ to R³″ form a 3- to 10-membered ring including the sulfur atom, and it is particularly desirable that the two of R¹″ to R³″ form a 5- to 7-membered ring including the sulfur atom.

When two of R¹″ to R³″ in formula (b-1) are bonded to each other to form a ring with the sulfur atom, the remaining one of R¹″ to R³″ is preferably an aryl group. As examples of the aryl group, the same as the above-mentioned aryl groups for R¹″ to R³″ can be exemplified.

R⁴″ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group as described for R¹″, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (the percentage of fluorine atoms within the alkyl group) is preferably from 10 to 100% and more preferably from 50 to 100%, and fluorinated alkyl groups in which all the hydrogen atoms are substituted with fluorine atoms (namely, perfluoroalkyl groups) are particularly desirable because the acid strength increases.

R⁴″ is most preferably a linear or cyclic alkyl group or a fluorinated alkyl group.

In formula (b-2), R⁵″ and R⁶″ each independently represents an aryl group or an alkyl group. At least one of R⁵″ and R⁶″ represents an aryl group. It is preferable that both of R⁵″ and R⁶″ represents an aryl group.

As the aryl group for R⁵″ and R⁶″, the same as the aryl groups for R¹″ to R³″ can be exemplified.

As the alkyl group for R⁵″ and R⁶″, the same as the alkyl groups for R¹″ to R³″ can be exemplified.

It is particularly desirable that both of R⁵″ and R⁶″ represents a phenyl group.

As R⁴″ in formula (b-2), the same as those mentioned above for R⁴″ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate;

1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl) tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalen-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical formula 19]

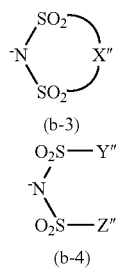

(b-3)

(b-4)

[wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or the alkyl group of Y" and Z" within the respective ranges for the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beams is improved.

The percentage of fluorine atoms within the alkylene group or alkyl group, namely the fluorination ratio, is preferably from 70 to 100% and more preferably from 90 to 100%, and it is particularly desirable that the alkylene group or alkyl group be a perfluoroalkylene group or perfluoroalkyl group in which all the hydrogen atoms are substituted with fluorine atoms.

Furthermore, as an onium salt-based acid generator, a sulfonium salt having a cation moiety represented by general formula (b-5) or (b-6) shown below may be used.

[Chemical formula 20]

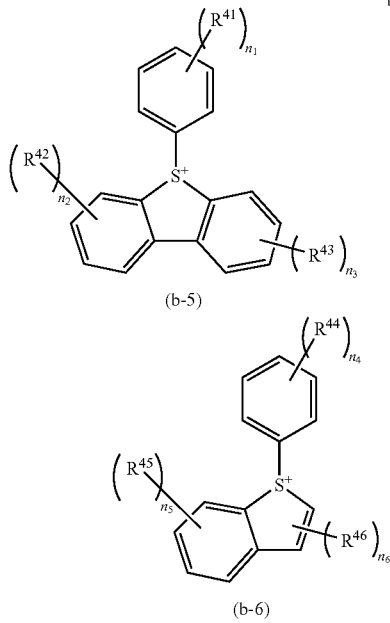

(b-5)

(b-6)

[wherein $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.]

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxy groups, and examples thereof include a hydroxymethyl group, hydroxyethyl group and hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within onium salt-based acid generators that have been proposed may be used. Examples of such anion moieties include fluorinated alkylsulfonate ion such as anion moieties ($R^{4"'}SO_3^-$) for onium salt-based acid generators represented by general formula (b-1) or (b-2) shown above; and anion moieties represented by general formula (b-3) or (b-4) shown above. Among these, fluorinated alkylsulfonate ions are preferable, fluorinated alkylsulfonate ions of 1 to 4 carbon atoms are more preferable, and linear perfluoroalkylsulfonate ions of 1 to 4 carbon atoms are particularly desirable. Specific examples include a trifluoromethylsulfonate ion, heptafluoro-n-propylsulfonate ion and nonafluoro-n-butylsulfonate ion.

In the present description, an oxime sulfonate-based acid generator is a compound having at least one group represented by general formula (B-1) shown below, and has a feature of generating acid upon irradiation. Such oxime sulfonate-based acid generators are widely used for chemically amplified resist compositions, and can be selected as appropriate.

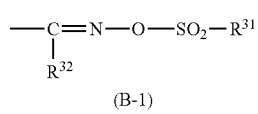

[Chemical formula 21]

(B-1)

[wherein $R^{31}$ and $R^{32}$ each independently represents an organic group.]

The organic group for $R^{31}$ and $R^{32}$ refers to a group containing a carbon atom, and may include atoms other than carbon atoms (such as a hydrogen atom, an oxygen atom, a nitrogen atom, a sulfur atom, or a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. Here, the expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms that has no substituent or a fluorinated alkyl group of 1 to 4 carbon atoms is particularly desirable.

As the organic group for $R^{32}$, a linear, branched or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

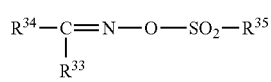

[Chemical formula 22]

(B-2)

[wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.]

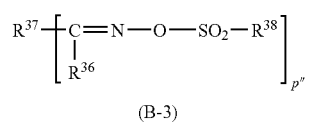

[Chemical formula 23]

(B-3)

[wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.]

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated allyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$ in general formula (B-2).

Examples of the divalent or trivalent aromatic hydrocarbon group for $R^{37}$ include groups in which one or two hydrogen atoms have been removed from the aryl group for $R^{34}$ in general formula (B-2).

Examples of the alkyl group having no substituent or the halogenated alkyl group for $R^{38}$ include the same groups as those exemplified above for the alkyl group having no substituent or the halogenated alkyl group for $R^{35}$ in general formula (B-2).

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (chemical formulas 18 and 19 shown in paragraphs [0012] to [0014]) and oxime sulfonate-based acid generators disclosed in International Patent Publication 04/074242 pamphlet (Examples 1 to 40 described on pages 65 to 85) may be preferably used.

Furthermore, as preferred examples, the following can be exemplified.

[Chemical formula 24]

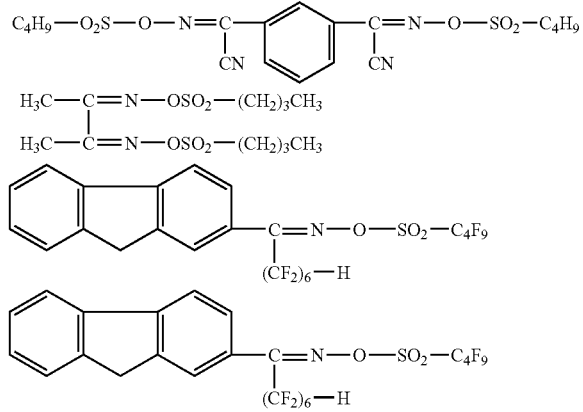

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used alone, or two or more types may be used in combination.

In the present invention, as the component (B), it is preferable to use an onium salt having a fluorinated alkylsulfonic acid ion as the anion moiety.

The quantity of the component (B) in the negative resist composition of the present invention is typically within a range from 0.5 to 30 parts by weight, and preferably 1 to 10 parts by weight, relative to 100 parts by weight of the component (A). When the quantity of the component (B) is within the above-mentioned range, formation of a resist pattern can be satisfactorily performed. Further, by virtue of the above-mentioned range, a uniform solution can be obtained and the storage stability becomes satisfactory.

<Component (C)>

There are no particular limitations on the component (C), which may be selected appropriately from the various cross-linkers used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical formula 25]

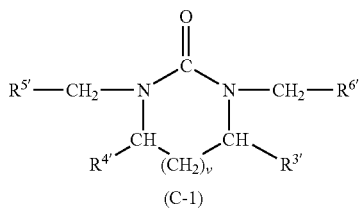

(C-1)

[wherein, $R^{5'}$ and $R^{6'}$ each independently represents a hydroxyl group or a lower alkoxy group, $R^{3'}$ and $R^{4'}$ each independently represents a hydrogen atom, a hydroxyl group or a lower alkoxy group, and v represents 0 or an integer of 1 to 2.]

The lower alkoxy group for $R^{5'}$ and $R^{6'}$ may be either a linear or branched group, and is preferably an alkoxy group of 1 to 4 carbon atoms. $R^{5'}$ and $R^{6'}$ may be either the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be either the same or different, and are preferably the same.

v is either 0 or an integer from 0 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group of 1 to 5 carbon atoms and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical formula 26]

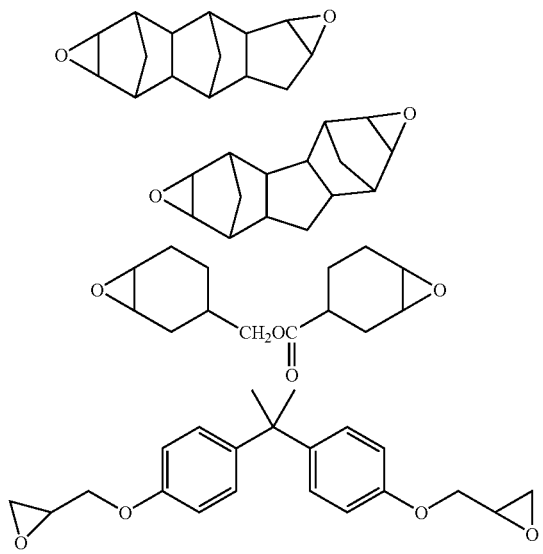

As the component (C), one type of cross-linker may be used alone, or two or more types may be used in combination.

The quantity of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the quantity of the component (C) is at least as large as the lower limit of the above-mentioned range, the formation of cross-linking is able to proceed favorably, and a favorable resist pattern with minimal swelling is obtained. On the other hand, by ensuring that the quantity is not more than the upper limit of the above-mentioned range, the storage stability of the resist coating liquid improves, and deterioration over time in the sensitivity can be suppressed.

<Component (D)>

In order to improve factors such as the resist pattern shape and the post exposure stability of the latent image formed by the pattern-wise exposure of the resist layer, it is preferable that the negative resist composition according to the present invention further includes a nitrogen-containing organic compound (D) (hereafter referred to as "component (D)") as an optional component.

A multitude of these components (D) have already been proposed, and any of these known compounds may be used, although a cyclic amine, an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (namely, alkylamines or alkyl alcohol amines). Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferable, and alkyl alcohol amines are the most desirable. Of these alkyl alcohol amines, triethanolamine and triisopropanolamine are the most preferred.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

One of the above compounds may be used alone, or two or more compounds may be used in combination.

In the present invention, of the various possibilities, an alkyl alcohol amine is preferably used as the component (D).

The component (D) is typically used in an amount within a range from 0.01 to 5.0 parts by weight, relative to 100 parts by weight of the component (A).

<Optional Components>

[Component (E)]

Furthermore, in the negative resist composition according to the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorus oxo acid derivatives include esters in which a hydrogen atom within an above-mentioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid esters, diphenyl phosphonate and dibenzyl phosphonate.

Examples of phosphinic acid derivatives include phosphinic acid esters such as phenylphosphinic acid esters.

As the component (E), one type may be used alone, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

If desired, other miscible additives can also be added to the negative resist composition according to the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The negative resist composition according to the present invention can be prepared by dissolving the materials for the resist composition in an organic solvent (hereafter, frequently referred to as "component (S)").

The component (S) may be any organic solvent which can dissolve the respective components to give a uniform solution, and any one or more types of organic solvent can be appropriately selected from those which have been conventionally known as solvents for chemically amplified resists.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate, and dipropylene glycol monoacetate, and compounds having an ether bond, such as a monoalkyl ether (such as a monomethyl ether, monoethyl ether, monopropyl ether or monobutyl ether) or a monophenyl ether of any of these polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and primary alcohols such as n-pentyl alcohol, s-pentyl alcohol, t-pentyl alcohol, isopentyl alcohol, isobutanol (also known as isobutyl alcohol or 2-methyl-1-propanol), isopropyl alcohol, 2-ethylbutanol, neopentyl alcohol, n-butanol, s-butanol, t-butanol, 1-propanol, n-hexanol, 2-heptanol, 3-heptanol, 2-methyl-1-butanol, 2-methyl-2-butanol and 4-methyl-2-pentanol.

These solvents may be used individually, or as a mixed solvent containing two or more different solvents.

Among these, as the component (S), PGMEA, PGME and EL are preferred.

Further, among the mixed solvents, a mixed solvent obtained by mixing PGMEA with a polar solvent is preferable. The mixing ratio (weight ratio) of the mixed solvent can be determined appropriately with due consideration of the compatibility of the PGMEA with the polar solvent, but is preferably within the range from 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The quantity used of the component (S) is not particularly limited, and is adjusted appropriately to a concentration that enables application of a coating solution to a substrate in accordance with the thickness of the coating film. In general, the organic solvent is used in a quantity that yields a solid content for the resist composition that is within the range from 2 to 20% by weight, and preferably from 5 to 15% by weight.

The negative resist composition of the present invention is capable of forming a resist film having a high hydrophobicity at the film surface, and also has the effect of producing favorable lithography properties. As a result, it is ideal for immersion exposure.

Immersion exposure is a method that includes a step of conducting exposure (immersion exposure) in a state where the region between the lens and the resist film formed on the wafer, which has conventionally been filled with air or an inert gas such as nitrogen, is filled with a solvent (a liquid immersion medium) having a larger refractive index than the refractive index of air.

In immersion exposure, when the resist film and the immersion solvent make contact, elution of substances within the resist film (such as the component (B) and the component (D)) into the immersion solvent (namely, substance elution) tends to occur. This substance elution causes phenomena such as degeneration of the resist layer and variation in the refractive index of the immersion solvent, causing a deterioration in the lithography properties. The amount of this substance elution is affected by the properties of the resist film surface (such as the hydrophilicity or hydrophobicity). Accordingly, it is thought that by increasing the hydrophobicity of the resist film surface, the degree of substance elution can be reduced.

The negative resist composition of the present invention includes a fluorine-containing resin component (F) containing a structural unit (f1) represented by general formula (f1-0) shown above, which has a polycyclic group within the main chain and also contains a fluorinated alkyl group, and a structural unit (f2) having an alkali-soluble group, and consequently compared with a composition that does not include the component (F), the hydrophobicity of a resist film formed using the composition of the present invention is significantly higher. Accordingly, the negative resist composition of the present invention is expected to be able to inhibit substance elution during immersion exposure.

Further, the negative resist composition of the present invention also exhibits favorable lithography properties such as the resolution, as is evident from the examples presented below. For example, by using the negative resist composition of the present invention, a very fine resist pattern can be formed in which the line width within a line and space (L/S) pattern is not more than 120 nm.

It is thought that the main reasons for this effect are that the structural unit (f1) that constitutes part of the component (F) contributes to the water repellency of the resist film, and the structural unit (f2) that constitutes part of the component (F) contributes to an improvement in the solubility of the composition in an alkali developing solution (namely, the solubility of the unexposed portions), resulting in an increase in the solubility contrast between the exposed portions and the unexposed portions.

By virtue of containing the component (F), a resist film formed using the negative resist composition of the present invention has a higher resist film hydrophobicity than a resist film that does not contain the component (F), and the contact angles relative to water, such as the static contact angle (the contact angle between the surface of a water droplet on the resist film in a horizontal state and the resist film surface), the dynamic contact angles (the contact angles at which a water droplet starts to slide when the resist film is inclined, including the contact angle at the front-end point of the water droplet in the sliding direction (advancing angle) and the contact angle at the rear-end point of the water droplet in the sliding direction (receding angle)), and the sliding angle (the inclination angle of the resin film at which a water droplet starts to slide when the resist film is inclined) are changed. For example, the higher the hydrophobicity of the resist film, the larger the static contact angle and the dynamic contact angles, and the smaller the sliding angle.

As shown in FIG. 1, when a flat surface 2 with a liquid droplet 1 placed thereon is gradually inclined, the advancing angle describes the angle $\theta_1$ between the surface of the liquid droplet at the bottom edge 1a of the liquid droplet 1 and the flat surface 2 when the liquid droplet 1 starts to move (slide) down the flat surface 2. Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the inclination angle $\theta_3$ of the flat surface 2 is the sliding angle.

In the present description, the static contact angle, dynamic contact angles and sliding angle are measured in the following manner.

First, a resist composition solution is spin-coated onto a silicon substrate, and then heated at a temperature of 80° C. or 120° C. for 60 seconds to form a resist film.

Subsequently, the contact angles can be measured using commercially available measurement apparatuses such as a DROP MASTER-700 (a product name, manufactured by Kyowa Interface Science Co. Ltd.), AUTO SLIDING ANGLE: SA-30 DM (a product name, manufactured by Kyowa Interface Science Co. Ltd.), and AUTO DISPENSER: AD-31 (a product name, manufactured by Kyowa Interface Science Co. Ltd.).

With the negative resist composition of the present invention, the measured value of the sliding angle for a resist film obtained using the resist composition is preferably no more than 25 degrees, more preferably no more than 24 degrees, and is most preferably 23 degrees or less. If the sliding angle is no more than 25 degrees, then the effect of the composition in suppressing substance elution during immersion exposure can be further enhanced.

Further, with the negative resist composition of the present invention, the measured value of the receding angle for a resist film obtained using the resist composition is preferably at least 50 degrees, and is more preferably within a range from 50 to 90 degrees.

Furthermore, with the negative resist composition of the present invention, the measured value of the static contact angle for a resist film obtained using the resist composition is preferably at least 80 degrees, and is also preferably no more than 95 degrees, and moreover preferably 90 degrees or less.

With the negative resist composition of the present invention, the measured value of the advancing angle for a resist film obtained using the resist composition is preferably within a range from 55 to 105 degrees.

Furthermore, as described above, it is expected that the present invention will be capable of suppressing the elution of substances from the resist film into the immersion solvent during immersion exposure. Accordingly, using the negative resist composition of the present invention in an immersion exposure process should enable degeneration of the resist film and changes in the refractive index of the immersion solvent to be suppressed. By suppressing fluctuation in the refractive index of the immersion solvent, the shape and the like of the resulting resist pattern can be improved.

Furthermore, staining of the lens of the exposure apparatus can also be reduced. As a result, protective measures for preventing such staining need not be performed, which contributes to a simplification of both the process and the exposure apparatus.

Moreover, as described above, in those cases where an immersion exposure is conducted using the scanning-type immersion exposure apparatus disclosed in Non-Patent Document 1, a water tracking ability wherein the immersion medium is capable of tracking the movement of the lens is required, and in the present invention, the hydrophobicity of the resist film is high, resulting in a superior water tracking ability.

Further, the negative resist composition of the present invention exhibits favorable lithography properties such as sensitivity and resolution, and when used as a resist in an immersion exposure process, is capable of forming a resist pattern without any practical problems.

In this manner, the negative resist composition of the present invention not only exhibits favorable lithography properties, but also has superior hydrophobicity and water tracking ability, and therefore satisfies all the properties required of a resist material for use with immersion exposure.

<<Method of Forming Resist Pattern>>

A method of forming a resist pattern according to the present invention includes: forming a resist film on a substrate using the negative resist composition of the present invention, exposing the resist film, and subjecting the resist film to alkali developing to form a resist pattern.

The method of forming a resist pattern according to the present invention can be conducted, for example, in the manner described below.

Firstly, a negative resist composition according to the present invention is applied onto a substrate using a spinner or the like, and a prebake (post applied bake (PAB)) is conducted at 80 to 150° C. for 40 to 120 seconds, and preferably for 60 to 90 seconds, to form a resist film.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) and an organic film such as a lower-layer organic film used in a multilayer resist method can be exemplified.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

After formation of a resist film, an organic antireflection film may be provided on the resist film, thereby forming a triple layer laminate consisting of the substrate, the resist film and the antireflection film. The antireflection film provided on top of the resist film is preferably soluble in an alkali developing solution.

The steps up until this point can be conducted by using conventional techniques. The operating conditions and the like are appropriately selected depending on the formulation and the characteristics of the negative resist composition being used.

Subsequently, the obtained resist film is subjected to selective exposure through a desired mask pattern. There are no particular limitations on the wavelength used for the exposure, and an ArF excimer laser, KrF excimer laser, $F_2$ excimer laser, or other radiation such as EUV (Extreme Ultra Violet), VUV (Vacuum Ultra Violet), EB (Electron Beam), X-ray or soft X-ray radiation can be used. A negative resist composition according to the present invention is effective for use with KrF excimer lasers or ArF excimer lasers, and is particularly effective for ArF excimer lasers.

The negative resist composition of the present invention can also be used as a negative resist composition for immersion exposure. In other words, the region between the resist film and the lens at the lowermost point of the exposure apparatus is pre-filled with a solvent (immersion medium) that has a larger refractive index than the refractive index of air, and the exposure (immersion exposure) is conducted in this state. There are no particular limitations on the wavelength used for the immersion exposure, and an ArF excimer laser, KrF excimer laser or $F_2$ excimer laser or the like can be used. The resist composition according to the present invention is effective for KrF or ArF excimer lasers, and is particularly effective for ArF excimer lasers.

The immersion medium preferably exhibits a refractive index larger than the refractive index of air but smaller than the refractive index of the resist film formed from the negative resist composition of the present invention. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A negative resist composition according to the present invention is particularly resistant to any adverse effects caused by water, and because the resulting sensitivity and shape of the resist pattern profile are excellent, water is preferably used as the immersion medium. Furthermore, water is also preferred in terms of cost, safety, environmental friendliness, and versatility.

Subsequently, following completion of the exposure step, post exposure baking (PEB) is conducted at 80 to 150° C. for 40 to 120 seconds, and preferably for 60 to 90 seconds. Then, a developing treatment is performed using, for example, a 0.1 to 10% by weight aqueous solution of tetramethylammonium hydroxide. Thereafter, a water rinse is preferably conducted with pure water, followed by drying. This water rinse can be conducted by dripping or spraying water onto the surface of the substrate while rotating the substrate, and washes away the developing solution and those portions of the negative resist composition that have been dissolved by the developing solution. Further, a bake treatment (post bake) can be conducted following the developing treatment. In this manner, a resist pattern is obtained in which the resist film (a coating of the negative resist composition) has been patterned into a shape faithful to the mask pattern.

EXAMPLES

As follows is a description of examples of the present invention, although the scope of the present invention is in no way limited by these examples.

<Fluorine-Containing Resin Component (F)>

In the examples and comparative examples, fluorine-containing resins (F)-1 to (F)-5 represented by chemical formula (F1) shown below (and all manufactured by Promerus, LLC) were used.

[Chemical formula 27]

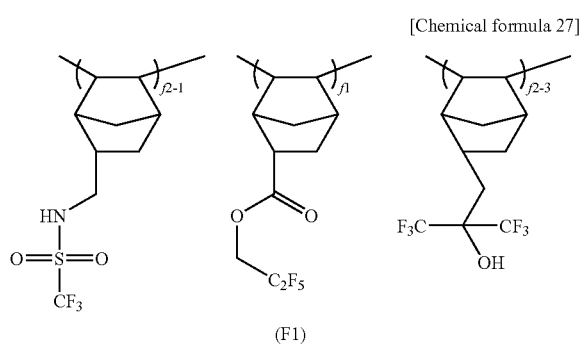

(F1)

As shown below in Table 1, the plurality of fluorine-containing resins (F)-1 to (F)-5 represented by the same chemical formula (F1) differ in terms of the respective proportions of the structural units that constitute each fluorine-containing resin. In chemical formula (F1), the subscripts (f1, f2-1 and f2-3) shown within parentheses ( ) at the right of each structural unit represent the proportion (mole %) of that structural unit relative to the combined total of all the structural units that constitute the fluorine-containing resin.

Further, for each of the fluorine-containing resins (F)-1 to (F)-5, the method described below was used to measure the solubility rate (the rate of thickness loss) of the resin film relative to an alkali developing solution. For each fluorine-containing resin, the result of this solubility rate measurement, the proportions of each structural unit within the resin, the weight average molecular weight (Mw), and the degree of dispersion (Mw/Mn) are shown in Table 1.

<Measurement of Dissolution Rate (Rate of Thickness Loss) of Resin Films>

Resin solutions of fixed concentration obtained by dissolving the fluorine-containing resins (F)-1 to (F)-5 in an organic solvent [a mixed solvent of PGMEA and PGME, wherein PGMEA:PGME=6:4 (weight ratio)] were each applied uniformly to an 8-inch silicon substrate, and subsequently subjected to a heat treatment for 60 seconds at 80° C. on a hotplate, thereby forming a resin film with the initial film thickness shown in Table 1.

Each resin film was immersed at 23° C. in a 2.38% by weight aqueous solution of tetramethylammonium hydroxide (TMAH), the time taken for the film thickness to reduce to zero was measured, and the dissolution rate for the resin film (thickness loss/immersion time, nm/s) was determined.

TABLE 1

|       | f2-1 | f1 | f2-3 | Mw   | Mw/Mn | Initial film thickness (nm) | Dissolution rate (nm/s) |
|-------|------|----|------|------|-------|------|-------|
| (F)-1 | 60   | 20 | 20   | 4,000 | 1.48 | 588.6 | 582.8 |
| (F)-2 | 20   | 10 | 70   | 4,000 | 1.63 | 519.6 | 379.3 |
| (F)-3 | 75   | 25 | 0    | 4,000 | 1.35 | 701.8 | 701.8 |
| (F)-4 | 40   | 60 | 0    | 4,000 | 1.72 | 526.1 | 35.0  |
| (F)-5 | 0    | 60 | 40   | 4,000 | 1.53 | 507.0 | 5.6   |

<Preparation of Negative Resist Compositions: Examples 1 to 20 and Comparative Example 1>

The components shown in Table 2 were mixed with the component (S) and dissolved to prepare a series of negative resist compositions.

In each example, the blend quantity of the component (S) was adjusted so that the solid fraction concentration was 6% by weight in each case.

TABLE 2

|  | Component (A) | Component (B) | Component (C) | Component (F) | Component (D) |
|---|---|---|---|---|---|
| Comparative Example 1 | (A)-1 [100] | (B-1) [3.7] | (C)-1 [5.8] | — | (D)-1 [0.6] |
| Example 1 | (A)-1 [100] | (B-1) [3.7] | (C)-1 [5.8] | (F)-1 [1.0] | (D)-1 [0.6] |
| Example 2 | (A)-1 [100] | (B-1) [3.7] | (C)-1 [5.8] | (F)-1 [2.0] | (D)-1 [0.6] |
| Example 3 | (A)-1 [100] | (B-1) [3.7] | (C)-1 [5.8] | (F)-1 [5.0] | (D)-1 [0.6] |
| Example 4 | (A)-1 [100] | (B-1) [3.7] | (C)-1 [5.8] | (F)-1 [10.0] | (D)-1 [0.6] |
| Example 5 | (A)-1 [100] | (B-1) [3.7] | (C)-1 [5.8] | (F)-2 [1.0] | (D)-1 [0.6] |
| Example 6 | (A)-1 [100] | (B-1) [3.7] | (C)-1 [5.8] | (F)-2 [2.0] | (D)-1 [0.6] |
| Example 7 | (A)-1 [100] | (B-1) [3.7] | (C)-1 [5.8] | (F)-2 [5.0] | (D)-1 [0.6] |
| Example 8 | (A)-1 [100] | (B-1) [3.7] | (C)-1 [5.8] | (F)-2 [10.0] | (D)-1 [0.6] |
| Example 9 | (A)-1 [100] | (B-1) [3.7] | (C)-1 [5.8] | (F)-3 [1.0] | (D)-1 [0.6] |
| Example 10 | (A)-1 [100] | (B-1) [3.7] | (C)-1 [5.8] | (F)-3 [2.0] | (D)-1 [0.6] |
| Example 11 | (A)-1 [100] | (B-1) [3.7] | (C)-1 [5.8] | (F)-3 [5.0] | (D)-1 [0.6] |
| Example 12 | (A)-1 [100] | (B-1) [3.7] | (C)-1 [5.8] | (F)-3 [10.0] | (D)-1 [0.6] |
| Example 13 | (A)-1 [100] | (B-1) [3.7] | (C)-1 [5.8] | (F)-4 [1.0] | (D)-1 [0.6] |
| Example 14 | (A)-1 [100] | (B-1) [3.7] | (C)-1 [5.8] | (F)-4 [2.0] | (D)-1 [0.6] |
| Example 15 | (A)-1 [100] | (B-1) [3.7] | (C)-1 [5.8] | (F)-4 [5.0] | (D)-1 [0.6] |
| Example 16 | (A)-1 [100] | (B-1) [3.7] | (C)-1 [5.8] | (F)-4 [10.0] | (D)-1 [0.6] |
| Example 17 | (A)-1 [100] | (B-1) [3.7] | (C)-1 [5.8] | (F)-5 [1.0] | (D)-1 [0.6] |
| Example 18 | (A)-1 [100] | (B-1) [3.7] | (C)-1 [5.8] | (F)-5 [2.0] | (D)-1 [0.6] |
| Example 19 | (A)-1 [100] | (B-1) [3.7] | (C)-1 [5.8] | (F)-5 [5.0] | (D)-1 [0.6] |
| Example 20 | (A)-1 [100] | (B-1) [3.7] | (C)-1 [5.8] | (F)-5 [10.0] | (D)-1 [0.6] |

The meanings of the abbreviations used in Table 2 are as shown below. The numerical values within the brackets [ ] represent blend quantities (parts by weight).

(A)-1: A Resin Represented by Chemical Formula (A1-1) Shown Below.

In the resin (A)-1, the ratio between the structural units (a1:a2, molar ratio), the weight average molecular weight (Mw) and the degree of dispersion (Mw/Mn) are as shown below.

[Chemical formula 28]

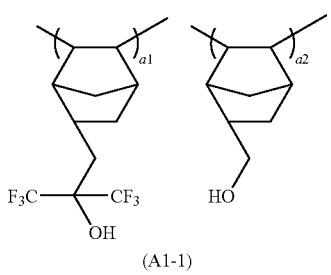

(A1-1)

[a1:a2=60:40 (molar ratio), Mw: 3,600, Mw/Mn: 1.48, manufactured by Promerus, LLC.]

(B)-1: triphenylsulfonium heptafluoro-n-propanesulfonate (C)-1: tetraethoxymethylated glycoluril E-9401 (a product name, manufactured by Sanwa chemical Co., Ltd.)

(F)-1 to (F)-5: the fluorine-containing resins (F)-1 to (F)-5 shown above in Table 1.

(D)-1: triisopropanolamine (S)-1: a mixed solvent of PGMEA/PGME=6/4 (weight ratio). Used as the component (S) for Examples 1 to 20 and Comparative Example 1.

<Evaluation of Hydrophobicity>

Using each of the negative resist compositions obtained above, the hydrophobicity of the resist film was evaluated using the procedure described below, by measuring the sliding angle, the static contact angle and the dynamic contact angle (the receding angle) for the resist film surface prior to exposure (hereafter this combination of angles is referred to jointly as "the contact angles").

[Procedure]

Each of the negative resist compositions of the examples shown in Table 2 was applied to an 8-inch silicon wafer using a spinner, was subsequently subjected to a prebake treatment for 60 seconds on a hotplate at the PAB temperature shown in Table 3 or 4, and was then dried, yielding a resist film with a film thickness of 160 nm.

Onto the surface of this resist film (the resist film prior to exposure) was dripped a water droplet of 50 μl, and a DROP MASTER-700 apparatus (a product name, manufactured by Kyowa Interface Science Co. Ltd.) was used to measure the contact angles. The results are shown in Table 3 and Table 4.

TABLE 3

| | PAB temperature (° C.) | Sliding angle (°) | Static contact angle (°) | Receding angle (°) |
|---|---|---|---|---|
| Comparative Example 1 | 90 | 25.0 | 81.2 | 57.4 |
| Example 1 | 90 | 24.5 | 83.9 | 58.8 |
| Example 2 | 90 | 24.5 | 83.4 | 57.3 |
| Example 3 | 90 | 23.5 | 83.9 | 59.4 |
| Example 4 | 90 | 22.5 | 85.3 | 63.6 |
| Example 5 | 90 | 24.5 | 83.0 | 59.2 |
| Example 6 | 90 | 24.5 | 82.6 | 57.0 |
| Example 7 | 90 | 23.5 | 82.0 | 59.3 |
| Example 8 | 90 | 23.0 | 82.7 | 60.8 |
| Example 9 | 90 | 25.0 | 83.2 | 57.9 |

TABLE 3-continued

| | PAB temperature (° C.) | Sliding angle (°) | Static contact angle (°) | Receding angle (°) |
|---|---|---|---|---|
| Example 10 | 90 | 25.0 | 84.2 | 60.0 |
| Example 11 | 90 | 24.5 | 84.5 | 60.7 |
| Example 12 | 90 | 23.0 | 87.1 | 64.8 |

TABLE 4

| | PAB temperature (° C.) | Sliding angle (°) | Static contact angle (°) | Receding angle (°) |
|---|---|---|---|---|
| Comparative Example 1 | 90 | 25.0 | 81.2 | 57.4 |
| Example 13 | 90 | 24.0 | 88.9 | 65.4 |
| Example 14 | 90 | 22.5 | 93.6 | 71.1 |
| Example 15 | 90 | 14.0 | 98.9 | 83.8 |
| Example 16 | 90 | 12.0 | 99.9 | 86.8 |
| Example 17 | 90 | 25.0 | 88.1 | 62.4 |
| Example 18 | 90 | 24.0 | 92.2 | 67.2 |
| Example 19 | 90 | 16.5 | 95.8 | 80.4 |
| Example 20 | 90 | 11.0 | 100.0 | 88.5 |

From the results in Tables 3 and 4 it was confirmed that the resist films obtained using the negative resist compositions of Examples 1 to 20 that included a fluorine-containing resin according to the present invention had a hydrophobicity that was either equal or superior to that of a resist film obtained using the negative resist composition of Comparative Example 1 that contained no fluorine-containing resin.

<Evaluation of Lithography Properties>

Each of the negative resist compositions obtained above was used to form a resist pattern using the method of forming a resist pattern described below.

[Method of Forming Resist Pattern]

An organic antireflection film composition AR-46 (a product name, manufactured by R&H Company) was applied uniformly onto a silicon wafer using a spinner, and the composition was then baked and dried on a hotplate at 215° C. for 60 seconds, thereby forming an organic antireflection film having a film thickness of 31 nm.

The negative resist composition of each example was applied uniformly onto the surface of the organic antireflection film using a spinner, and was then prebaked (PAB treatment) on a hotplate at 80° C. for 60 seconds, thereby forming a resist film having a film thickness of 160 nm.

Subsequently, the resist film was selectively exposed with an ArF excimer laser (193 nm) through a (half-tone) mask pattern, using an ArF exposure apparatus NSR-S302 (a product name, manufactured by Nikon Corporation, NA (numerical aperture)=0.60, ⅔ annular illumination).

A post exposure baking (PEB) treatment was then conducted at 110° C. for 60 seconds, the resist film was subjected to alkali developing for 60 seconds at 23° C. in a 2.38% by weight aqueous solution of tetramethylammonium hydroxide (TMAH) (product name: NMD-3, manufactured by Tokyo Ohka Kogyo Co., Ltd.), and was then rinsed with water for 30 seconds and dried, thereby forming a line and space (1:1) resist pattern (L/S pattern).

As a result, in each example, a L/S pattern resist pattern was formed in which lines having a line width of 120 nm were arranged with an equidistant spacing therebetween (pitch: 240 nm).

The optimum exposure Eop (mJ/cm$^2$; the sensitivity) for formation of the L/S pattern having a line width of 120 nm and a pitch of 240 nm was also determined. The results are shown in Tables 5 and 6.

TABLE 5

| | Eop (mJ/cm$^2$) |
|---|---|
| Comparative example 1 | 28.0 |
| Example 1 | 25.0 |
| Example 2 | 23.0 |
| Example 3 | 29.0 |
| Example 4 | 38.0 |
| Example 5 | 25.0 |
| Example 6 | 27.0 |
| Example 7 | 29.0 |
| Example 8 | 33.0 |
| Example 9 | 25.0 |
| Example 10 | 28.0 |
| Example 11 | 26.0 |
| Example 12 | 29.0 |

TABLE 6

| | Eop (mJ/cm$^2$) |
|---|---|
| Comparative example 1 | 28.0 |
| Example 13 | 25.0 |
| Example 14 | 28.0 |
| Example 15 | 25.0 |
| Example 16 | 22.0 |
| Example 17 | 25.0 |
| Example 18 | 26.0 |
| Example 19 | 24.0 |
| Example 20 | 22.0 |

Accordingly, it was confirmed that by using the negative resist composition of the present invention and a method of forming a resist pattern that uses the negative resist composition, a resist film having a high hydrophobicity at the film surface could be formed, and favorable lithography properties could also be achieved.

Because the present invention is able to provide a negative resist composition and a method of forming a resist pattern that are capable of forming a resist film having a high hydrophobicity at the film surface as well as favorable lithography properties, the invention is extremely useful industrially.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A negative resist composition comprising:
   a fluorine-containing resin component (F) containing a structural unit (f1) represented by a general formula (f1-0) shown below, and a structural unit (f2) having an alkali-soluble group,
   an alkali-soluble resin component (A) excluding said fluorine-containing resin component (F),
   an acid generator component (B) that generates acid upon exposure, and
   a cross-linking component (C),

[Chemical formula 1]

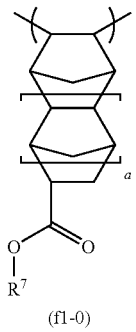

(f1-0)

[wherein, R$^7$ represents a fluorinated alkyl group, and a represents either 0 or 1].

2. A negative resist composition according to claim 1, wherein said alkali-soluble group is a fluorinated group.

3. A negative resist composition according to claim 2, wherein said alkali-soluble group is at least one group selected from the group consisting of groups represented by a general formula (f2-0-1) shown below, groups represented by a general formula (f2-0-2) shown below, and groups represented by a general formula (f2-0-3) shown below:

[Chemical formula 2]

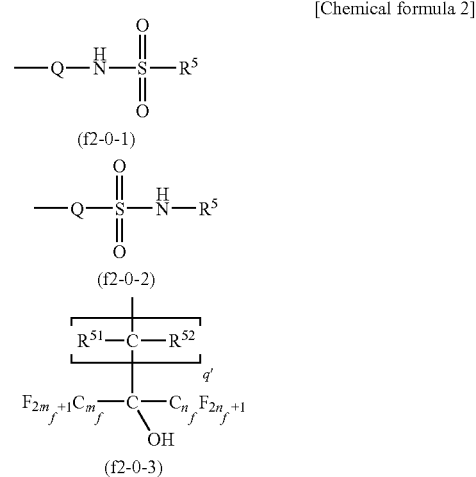

[wherein, in said formula (f2-0-1), Q represents a divalent linking group or a single bond, and R$^5$ represents a fluorinated alkyl group; in said formula (f2-0-2), Q and R$^5$ are as defined above; and in said formula (f2-0-3), R$^{51}$ and R$^{52}$ each independently represents a hydrogen atom, a lower alkyl group of 1 to 5 carbon atoms, a fluorine atom or a fluorinated lower alkyl group, m$_f$ and n$_f$ each independently represents an integer of 0 to 5 (provided that m$_f$+n$_f \geq 1$), and q' represents an integer of 0 to 5].

4. A negative resist composition according to claim 3, wherein said structural unit (f2) comprises a structural unit (f2-0) represented by a general formula (f2-0) shown below:

[Chemical formula 3]

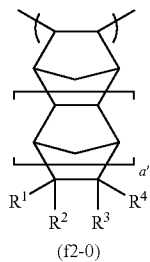

(f2-0)

[wherein, $R^1$ to $R^4$ each independently represents a hydrogen atom, a fluorine atom, a linear or branched alkyl group, a fluorinated alkyl group, a group represented by said general formula (f2-0-1), a group represented by said general formula (f2-0-2), or a group represented by said general formula (f2-0-3), provided that at least one of $R^1$ to $R^4$ is a group represented by said general formula (f2-0-1), a group represented by said general formula (f2-0-2), or a group represented by said general formula (f2-0-3), and a' represents either 0 or 1].

5. A negative resist composition according to claim 4, wherein said fluorine-containing resin component (F) comprises said structural unit (f1), and a structural unit (f2-1), which is represented by said general formula (f2-0), in which at least one of said $R^1$ to $R^4$ is an alkali-soluble group represented by said general formula (f2-0-1).

6. A negative resist composition according to claim 4, wherein said fluorine-containing resin component (F) comprises said structural unit (f1), and a structural unit (f2-3), which is represented by said general formula (f2-0), in which at least one of said $R^1$ to $R^4$ is an alkali-soluble group represented by said general formula (f2-0-3).

7. A negative resist composition according to either claim 5 or claim 6, wherein said fluorine-containing resin component (F) comprises said structural unit (f1), said structural unit (f2-1), and said structural unit (f2-3).

8. A negative resist composition according to claim 1, wherein a quantity of said fluorine-containing resin component (F) is within a range from 0.05 to 12 parts by weight relative to 100 parts by weight of said alkali-soluble resin component (A).

9. A negative resist composition according to claim 1, wherein said cross-linking component (C) is at least one type of cross-linker selected from the group consisting of melamine-based cross-linkers, urea-based cross-linkers, alkylene urea-based cross-linkers, glycoluril-based cross-linkers and epoxy-based cross-linkers.

10. A negative resist composition according to claim 1, further comprising a nitrogen-containing organic compound (D).

11. A method of forming a resist pattern, comprising: forming a resist film on a substrate using a negative resist composition according to claim 1, exposing said resist film, and subjecting said resist film to alkali developing to form a resist pattern.

* * * * *